US012252644B2

(12) United States Patent
Kato et al.

(10) Patent No.: US 12,252,644 B2
(45) Date of Patent: Mar. 18, 2025

(54) POLARIZER AND IMAGE DISPLAY DEVICE

(71) Applicant: FUJIFILM Corporation, Tokyo (JP)

(72) Inventors: Yumi Kato, Kanagawa (JP); Yasukazu Kuwayama, Kanagawa (JP); Yoshiaki Takada, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 78 days.

(21) Appl. No.: 17/698,493

(22) Filed: Mar. 18, 2022

(65) Prior Publication Data

US 2022/0204856 A1 Jun. 30, 2022

Related U.S. Application Data

(63) Continuation of application No. PCT/JP2020/034448, filed on Sep. 11, 2020.

(30) Foreign Application Priority Data

Sep. 26, 2019 (JP) .................................. 2019-175224

(51) Int. Cl.
| | | |
|---|---|---|
| G02F 1/1333 | (2006.01) | |
| C09K 19/38 | (2006.01) | |
| C09K 19/60 | (2006.01) | |
| G02B 5/30 | (2006.01) | |

(52) U.S. Cl.
CPC ........ C09K 19/601 (2013.01); C09K 19/3852 (2013.01); C09K 19/3861 (2013.01); G02B 5/3016 (2013.01); C09K 2323/031 (2020.08)

(58) Field of Classification Search
CPC .. C09K 19/601; C09K 19/38; C09K 19/3804; C09K 19/3852; C09K 19/3861; C09K 19/3491; C09K 2323/031; C09K 2019/0444; C09K 2019/0448; C09K 2019/546; G02F 1/1333; G02F 1/1335; G02F 1/133528
See application file for complete search history.

(56) References Cited

U.S. PATENT DOCUMENTS

| | | | |
|---|---|---|---|
| 2015/0192700 A1* | 7/2015 | Won ........................ | G02B 5/208 252/585 |
| 2018/0265707 A1* | 9/2018 | Mizumura ............. | H10K 50/00 |
| 2019/0071571 A1 | 3/2019 | Takada et al. | |
| 2019/0264106 A1 | 8/2019 | Takahashi et al. | |
| 2019/0382586 A1* | 12/2019 | Katou ............... | G02F 1/133509 |
| 2020/0318010 A1 | 10/2020 | Hoshino et al. | |
| 2020/0326590 A1 | 10/2020 | Shibata et al. | |
| 2021/0055604 A1* | 2/2021 | Hoshino ................ | H05B 33/02 |
| 2021/0072443 A1* | 3/2021 | Hoshino ................ | H10K 59/00 |
| 2021/0109270 A1* | 4/2021 | Hoshino ............. | G02B 5/3016 |
| 2022/0204856 A1* | 6/2022 | Kato ....................... | H10K 59/00 |
| 2023/0043275 A1* | 2/2023 | Katou ................ | C09K 19/3497 |

FOREIGN PATENT DOCUMENTS

| | | |
|---|---|---|
| CN | 110023347 A | 7/2019 |
| JP | 11-101964 A | 4/1999 |
| JP | 2011-048309 A | 3/2011 |
| JP | 2011-237513 A | 11/2011 |
| JP | 2013-210624 A | 10/2013 |
| JP | 2019-120949 A | 7/2019 |
| WO | 2017/090668 A1 | 6/2017 |
| WO | 2017/195833 A1 | 11/2017 |
| WO | 2018/164252 A1 | 9/2018 |
| WO | 2019/131943 A1 | 7/2019 |
| WO | 2019/132018 A1 | 7/2019 |
| WO | 2019/189345 A1 | 10/2019 |
| WO | WO-2021182160 A1 * | 9/2021 ............. C09K 19/20 |

OTHER PUBLICATIONS

Office Action, issued by the Japanese Patent Office on Nov. 29, 2022, in connection with Japanese Patent Application No. 2021-548802.
International Search Report issued in PCT/JP2020/034448 on Nov. 24, 2020.
Written Opinion issued in PCT/JP2020/034448 on Nov. 24, 2020.
International Preliminary Report on Patentability completed by WIPO on Mar. 15, 2022 in connection with International Patent Application No. PCT/JP2020/034448.
Office Action, issued by the State Intellectual Property Office of China Oct. 11, 2023, in connection with Chinese Patent Application No. 202080067564.0.
Office Action, which was issued by China National Intellectual Property Administration on Mar. 5, 2024, in connection with Chinese Patent Application No. 202080067564.0.

* cited by examiner

*Primary Examiner* — Geraldina Visconti
(74) *Attorney, Agent, or Firm* — Edwards Neils LLC; Jean C. Edwards, Esq.

(57) ABSTRACT

Provided is a polarizer with excellent durability and an image display device including the polarizer. The polarizer includes a composition for forming a polarizer which contains a polymer liquid crystal compound and a dichroic material, in which the dichroic material includes a first dichroic material and a second dichroic material, an absolute value of a difference between a log P value of the first dichroic material and a log P value of the second dichroic material is 1.0 or less, and a stabilization energy indicating an energy loss in a case where one dichroic material of the first dichroic material and the second dichroic material is incorporated into a structure singly formed of the other dichroic material that is aligned therein is 30 kcal/mol or less.

18 Claims, No Drawings

POLARIZER AND IMAGE DISPLAY DEVICE

CROSS-REFERENCE TO RELATED APPLICATIONS

This application is a Continuation of PCT International Application No. PCT/JP2020/034448 filed on Sep. 11, 2020, which was published under PCT Article 21(2) in Japanese, and which claims priority under 35 U.S.C. § 119(a) to Japanese Patent Application No. 2019-175224 filed on Sep. 26, 2019. The above applications are hereby expressly incorporated by reference, in their entirety, into the present application.

BACKGROUND OF THE INVENTION

1. Field of the Invention

The present invention relates to a polarizer and an image display device.

2. Description of the Related Art

In the related art, in a case where an attenuation function, a polarization function, a scattering function, a light-shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical rotation or birefringence in display. Further, a circular polarizer is used in an organic light emitting diode (OLED) to prevent reflection of external light.

In the related art, iodine has been widely used as a dichroic material in these polarizers, but a polarizer that uses an organic dye in place of iodine as a dichroic material has also been examined.

For example, JP2011-48309A discloses a composition for forming a polarizer which contains a dichroic material and does not contain a liquid crystal non-colored compound. Further, JP2013-210624A discloses a composition for forming a polarizer which contains a dichroic material and a low-molecular-weight liquid crystal compound.

SUMMARY OF THE INVENTION

In recent years, from the viewpoint of improving the degree of alignment of a polarizer, use of a polymer liquid crystal compound as a liquid crystal compound used together with a dichroic material has been examined.

As a result of preparation of a polarizer formed of a composition for forming a polarizer that contains a polymer liquid crystal compound and a dichroic material and evaluation of this polarizer, the present inventors found that there is room for improvement in durability depending on the kind of the dichroic material.

In consideration of the above-described circumstances, an object of the present invention is to provide a polarizer with excellent durability and an image display device including the polarizer.

As a result of intensive research on the above-described problem, the present inventors found that in a polarizer formed of a composition for forming a polarizer which contains a polymer liquid crystal compound and a dichroic material, a first dichroic material and a second dichroic material, in which an absolute value of a difference between the log P values is less than or equal to a predetermined value and the stabilization energy is less than or equal to a predetermined value, are used, a polarizer with excellent durability is obtained, thereby completing the present invention.

That is, the present inventors found that the above-described problems can be solved by employing the following configurations.

[1] A polarizer comprising: a composition for forming a polarizer which contains a polymer liquid crystal compound and a dichroic material, in which the dichroic material includes a first dichroic material and a second dichroic material, an absolute value of a difference between a log P value of the first dichroic material and a log P value of the second dichroic material is 1.0 or less, and a stabilization energy indicating an energy loss in a case where one dichroic material of the first dichroic material and the second dichroic material is incorporated into a structure singly formed of the other dichroic material that is aligned therein is 30 kcal/mol or less.

[2] The polarizer according to [1], in which the first dichroic material is a compound represented by Formula (1).

In Formula (1), Ar1 and Ar2 each independently represent a phenylene group which may have a substituent or a naphthylene group which may have a substituent.

In Formula (1), R1 represents a hydrogen atom, an alkyl group, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group, which may have a substituent.

In Formula (1), R2 and R3 each independently represent a hydrogen atom, an alkyl group, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, which may have a substituent, and R2 and R3 may be bonded to each other to form a ring, and R2 or R3 may be bonded to Ar2 to form a ring.

[3] The polarizer according to [1] or [2], in which the second dichroic material is a compound represented by Formula (2).

In Formula (2), n represents 1 or 2.

In Formula (2), Ar3, Ar4, and Ar5 each independently represent a phenylene group which may have a substituent, a naphthylene group which may have a substituent, or a heterocyclic group which may have a substituent.

In Formula (2), R4 represents a hydrogen atom, an alkyl group, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group, which may have a substituent.

In Formula (2), R5 and R6 each independently represent a hydrogen atom, an alkyl group, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, which may have a substituent.

R5 and R6 may be bonded to each other to form a ring, and R5 or R6 may be bonded to Ar5 to form a ring.

[4] The polarizer according to [3], in which in Formula (2), n represents 1.

[5] The polarizer according to [3] or [4], in which in Formula (2), at least one of R5 or R6 represents a methyl group.

[6] The polarizer according to any one of [1] to [5], in which the first dichroic material has a maximum absorption wavelength in a range of 560 nm or greater and 700 nm or less, and the second dichroic material has a maximum absorption wavelength in a range of 455 nm or greater and less than 560 nm.

[7] The polarizer according to any one of [2] to [6], in which the log P value of the first dichroic material is greater than the log P value of the second dichroic material.

[8] The polarizer according to any one of [1] to [6], in which a content of the dichroic material is 5% by mass or greater with respect to a total mass of the polarizer.

[9] An image display device comprising: the polarizer according to any one of [1] to [8].

According to the present invention, it is possible to provide a polarizer with excellent durability and an image display device including the polarizer.

DESCRIPTION OF THE PREFERRED EMBODIMENTS

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Respective components may be used alone or in combination of two or more kinds thereof. Here, in a case where two or more kinds of respective components are used in combination, the content of the components indicates the total content unless otherwise specified.

Further, "(meth)acrylate" denotes "acrylate" or "methacrylate", "(meth)acryl" denotes "acryl" or "methacryl", and "(meth)acryloyl" denotes "acryloyl" or "methacryloyl". In the present specification, the "total solid content" of a composition for forming a polarizer denotes components forming the polarizer, and denotes all components excluding solvents in a case where the composition for forming a polarizer contains solvents. Further, a liquid component is also regarded as a solid content in a case where the liquid component forms the polarizer.

[Polarizer]

The polarizer according to the embodiment of the present invention is a polarizer including a composition for forming a polarizer which contains a polymer liquid crystal compound and a dichroic material, in which the dichroic material includes a first dichroic material and a second dichroic material, an absolute value of a difference between a log P value of the first dichroic material and a log P value of the second dichroic material is 1.0 or less, and a stabilization energy indicating an energy loss in a case where one dichroic material of the first dichroic material and the second dichroic material is incorporated into a structure singly formed of the other dichroic material that is aligned therein is 30 kcal/mol or less.

The polarizer according to the embodiment of the present invention has excellent durability. In the present invention, the expression "the polarizer has excellent durability" indicates that the degree of polarization of the polarizer is unlikely to decrease with time.

The details of the reason why the polarizer according to the embodiment of the present invention has excellent durability are not clear, but it is assumed as follows.

It is considered that the compatibility between the first dichroic material and the second dichroic material increases as the log P values of the first dichroic material and the second dichroic material are close to each other. In this manner, even in a case where the polarizer is placed in a high temperature environment or a moist heat environment, the precipitation of one of the dichroic materials can be suppressed, and thus a decrease in the degree of polarization with time can be suppressed.

Further, it is considered that since the stabilization energy calculated using the first dichroic material and the second dichroic material is small, one dichroic material is likely to be incorporated into a structure singly formed of the other dichroic material aligned therein. That is, it is considered that in a case where the stabilization energy is in the above-described range, the first dichroic material and the second dichroic material form an aggregate and/or a crystal structure, and the amount of the dichroic material that does not form an aggregate is reduced in the polarizer. In this manner, a decrease in the degree of polarization with time is considered to be suppressed because the decomposition of the dichroic material can be suppressed even in a case where the polarizer is irradiated with light.

As described above, it is assumed that a polarizer with excellent durability can be obtained because the effect obtained by the log P value and the effect obtained by the stabilization energy function synergistically.

Hereinafter, excellent durability of the polarizer is also referred to as excellent effects of the present invention.

From the viewpoint that the effects of the present invention are more excellent, it is preferable that the polarizer according to the embodiment of the present invention has an alignment structure formed of the first dichroic material and the second dichroic material. In the present invention, the alignment structure formed of the first dichroic material and the second dichroic material indicates a state in which one or more molecules of the first dichroic material and one or more molecules of the second dichroic material are aggregated to form an aggregate in the polarizer and a plurality of molecules of the dichroic materials are periodically arranged in the aggregate.

Further, from the viewpoint that the effects of the present invention are more excellent, it is preferable that the first dichroic material and the second dichroic material form an aggregate in the polarizer. Examples of a method of verifying that the first dichroic material and the second dichroic material form an aggregate include a method based on the maximum absorption wavelength.

Further, from the viewpoint that the effects of the present invention are more excellent, it is preferable that the first dichroic material and the second dichroic material have a crystal structure in the polarizer. As a method of verifying that the first dichroic material and the second dichroic material form a crystal structure, a method of using an X-ray diffraction (XRD) method is exemplified.

In the polarizer according to the embodiment of the present invention, the first dichroic material may also be polymerized. Similarly, the second dichroic material may also be polymerized in the polarizer.

[Composition for Forming Polarizer]

The composition for forming a polarizer (hereinafter, also referred to as the "present composition") used for forming the polarizer according to the embodiment of the present invention contains a polymer liquid crystal compound and a dichroic material formed of a first dichroic material and a second dichroic material. The present composition may contain a low-molecular-weight liquid crystal compound, a third dichroic material, a solvent, a polymerization initiator, an interface improver, or components other than these components as necessary.

In the following description, the polymer liquid crystal compound and the low-molecular-weight liquid crystal compound may be collectively referred to as a "liquid crystal compound".

Hereinafter, each component will be described.

<Liquid Crystal Compound>

The present composition contains a liquid crystal compound. In a case where the composition contains a liquid crystal compound, the dichroic materials can be aligned with a high degree of alignment while the precipitation of the dichroic materials is suppressed. The liquid crystal compound is a liquid crystal compound that does not exhibit dichroism.

The liquid crystal compound contains a polymer liquid crystal compound, and may further contain a low-molecular-weight liquid crystal compound. Here, the "low-molecular-weight liquid crystal compound" indicates a liquid crystal compound having no repeating units in the chemical structure. Here, the "polymer liquid crystal compound" indicates a liquid crystal compound having a repeating unit in the chemical structure.

(Polymer Liquid Crystal Compound)

Examples of the polymer liquid crystal compound include thermotropic liquid crystal polymers described in JP2011-237513A.

Further, from the viewpoint that the light absorption anisotropic film has excellent hardness (particularly, the bending resistance), the polymer liquid crystal compound may contain a crosslinkable group at the terminal. Examples of the crosslinkable group include the polymerizable groups described in paragraphs [0040] to [0050] of JP2010-244038A. Among these, from the viewpoint of improving the reactivity and the synthetic suitability, an acryloyl group, a methacryloyl group, an epoxy group, an oxetanyl group, and a styryl group are preferable, and an acryloyl group and a methacryloyl group are more preferable.

From the viewpoint that the effects of the present invention are more excellent, it is preferable that the polymer liquid crystal compound has a repeating unit represented by Formula (1L) (hereinafter, also referred to as a "repeating unit (1L)").

(1L)

In Formula (1L), P1 represents the main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

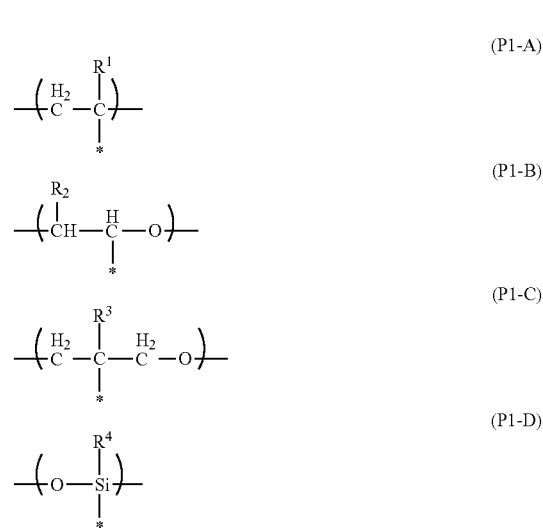

In Formulae (P1-A) to (P1-D), "*" represents a bonding position with respect to L1 in Formula (1L). In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound having the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^4(OR^5)_2$—. In the formula, $R^4$ has the same definition as that for $R^4$ in Formula (P1-D), and a plurality of $R^5$'s each independently represent a hydrogen atom or an alkyl group having 1 to 10 carbon atoms.

$L^1$ represents a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, R³ and R⁴ each independently represent a hydrogen atom or an alkyl group having 1 to 6 carbon atoms which may have a substituent (described below).

In a case where P1 represents a group represented by Formula (P1-A), from the viewpoint that the effects of the present invention are more excellent, it is preferable that L1 represents a group represented by —C(O)O—.

In a case where P1 represents a group represented by any of Formulae (P1-B) to (P1-D), from the viewpoint that the effects of the present invention are more excellent, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—(CH$_2$—CH$_2$O)$_{n1}$—* is preferable. In the formula, n1 represents an integer of 1 to 20, and "*" represents a bonding position with respect to L1 or M1 in Formula (1L). From the viewpoint that the effects of the present invention are more excellent, n1 represents preferably an integer of 2 to 10, more preferably an integer of 2 to 4, and most preferably 3.

Further, from the viewpoint that the effects of the present invention are more excellent, a group represented by *—(CH(CH$_3$)—CH$_2$O)$_{n2}$—* is preferable as the oxypropylene structure represented by SP1. In the formula, n2 represents an integer of 1 to 3, and * represents a bonding position with respect to L1 or M1.

Further, from the viewpoint that the effects of the present invention are more excellent, a group represented by *—(Si(CH$_3$)$_2$—O)$_{n3}$—* is preferable as the polysiloxane structure represented by SP1. In the formula, n3 represents an integer of 6 to 10, and * represents a bonding position with respect to L1 or M1.

Further, from the viewpoint that the effects of the present invention are more excellent, a group represented by *—(CF$_2$—CF$_2$)$_{n4}$—* is preferable as the alkylene fluoride structure represented by SP1. In the formula, n4 represents an integer of 6 to 10, and * represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and can refer to, for example, particularly description on pages 7 to 16 of "FlussigeKristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee.

As the mesogen group, for example, a group having at least one cyclic structure selected from the group consisting of an aromatic hydrocarbon group, a heterocyclic group, and an alicyclic group is preferable.

From the viewpoint that the effects of the present invention are more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group, a group represented by Formula (M1-A) or Formula (M1-B) is preferable, and a group represented by Formula (M1-B) is more preferable.

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent.

It is preferable that the divalent group represented by A1 is a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the degree of alignment.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention are more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the effects of the present invention are more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, from the viewpoint that the effects of the present invention are more excellent, —C(O)O— is preferable. LA1 may represent a group obtained by combining two or more of these groups.

Specific examples of M1 include the following structures. In the following specific examples, "Ac" represents an acetyl group.

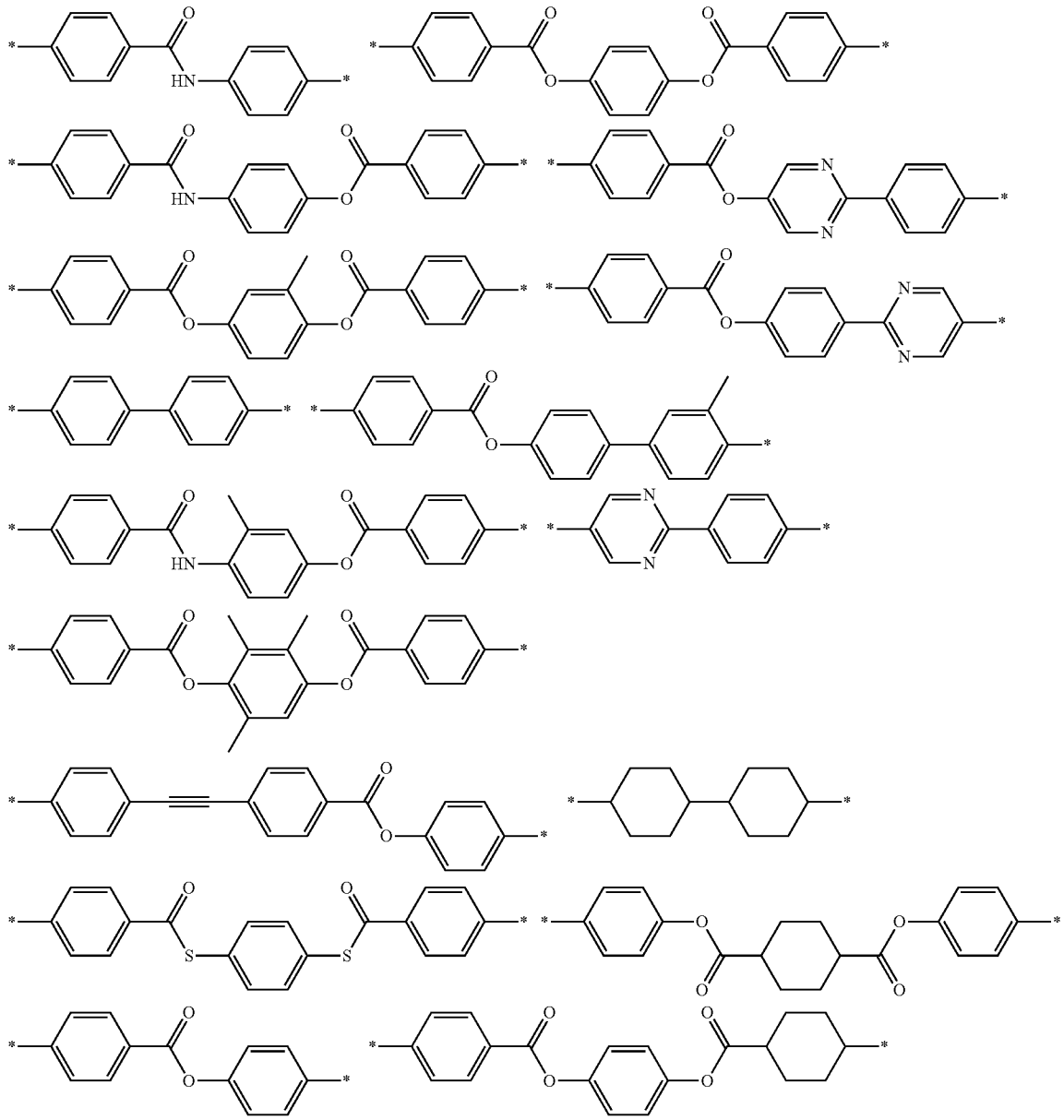

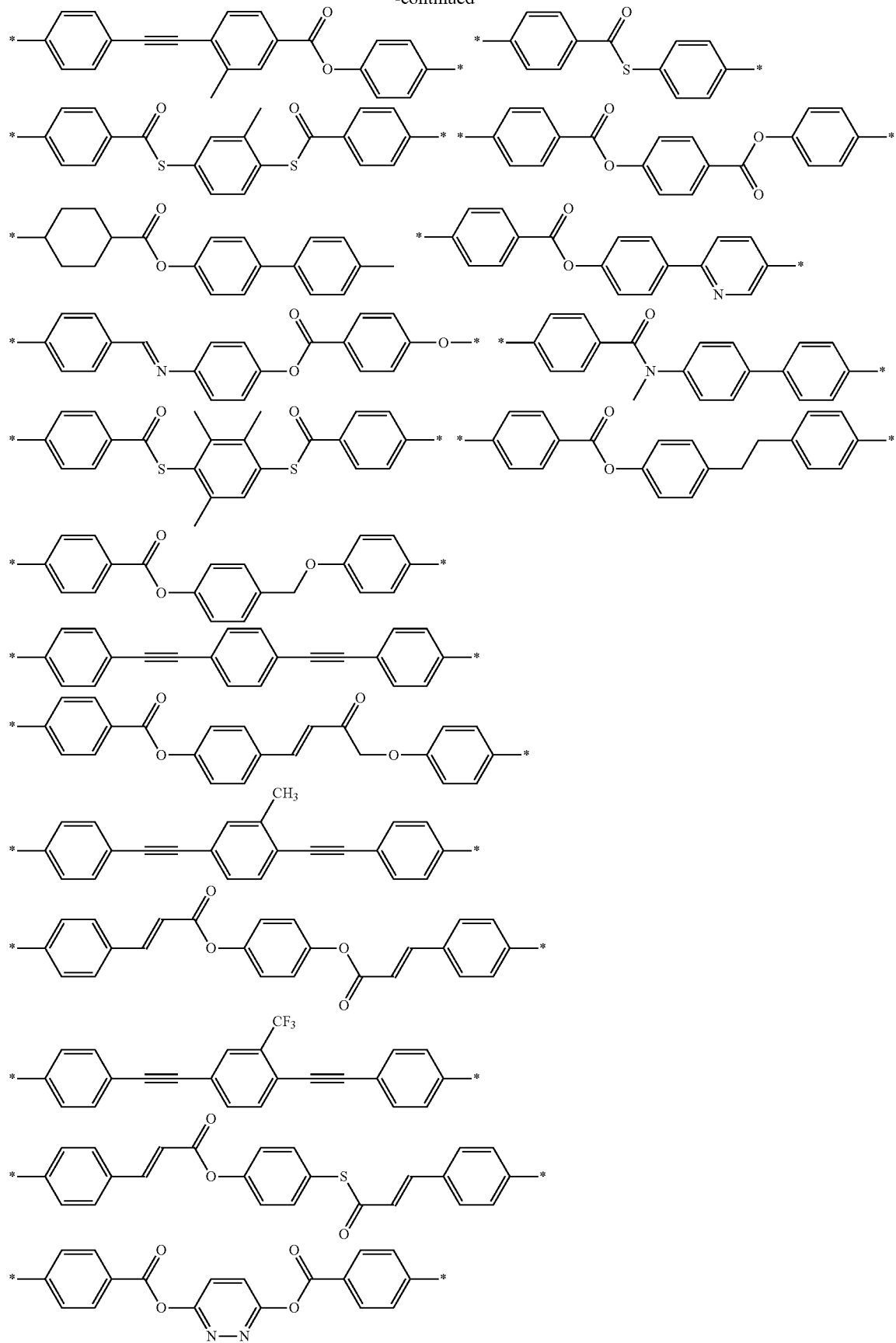

-continued
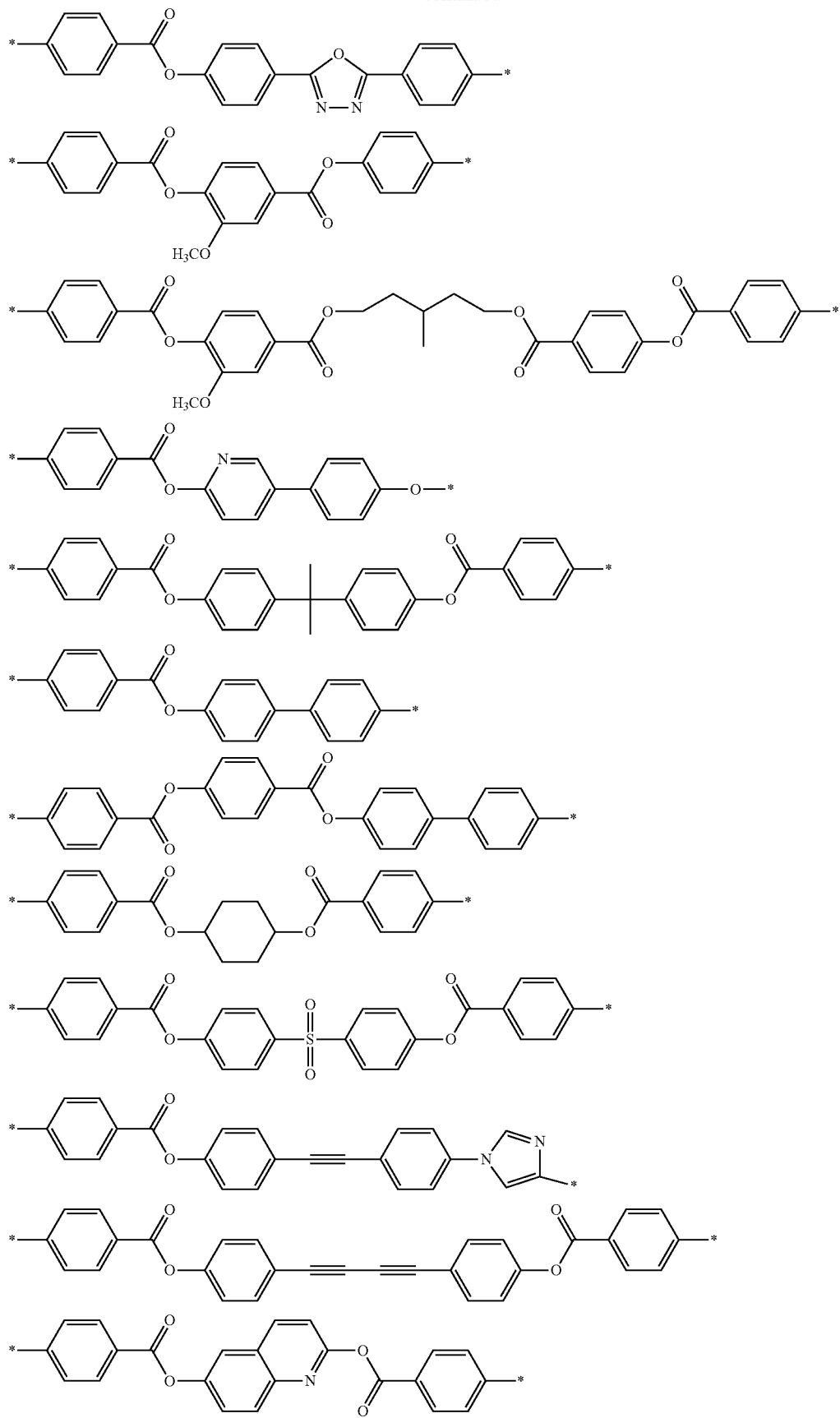

-continued
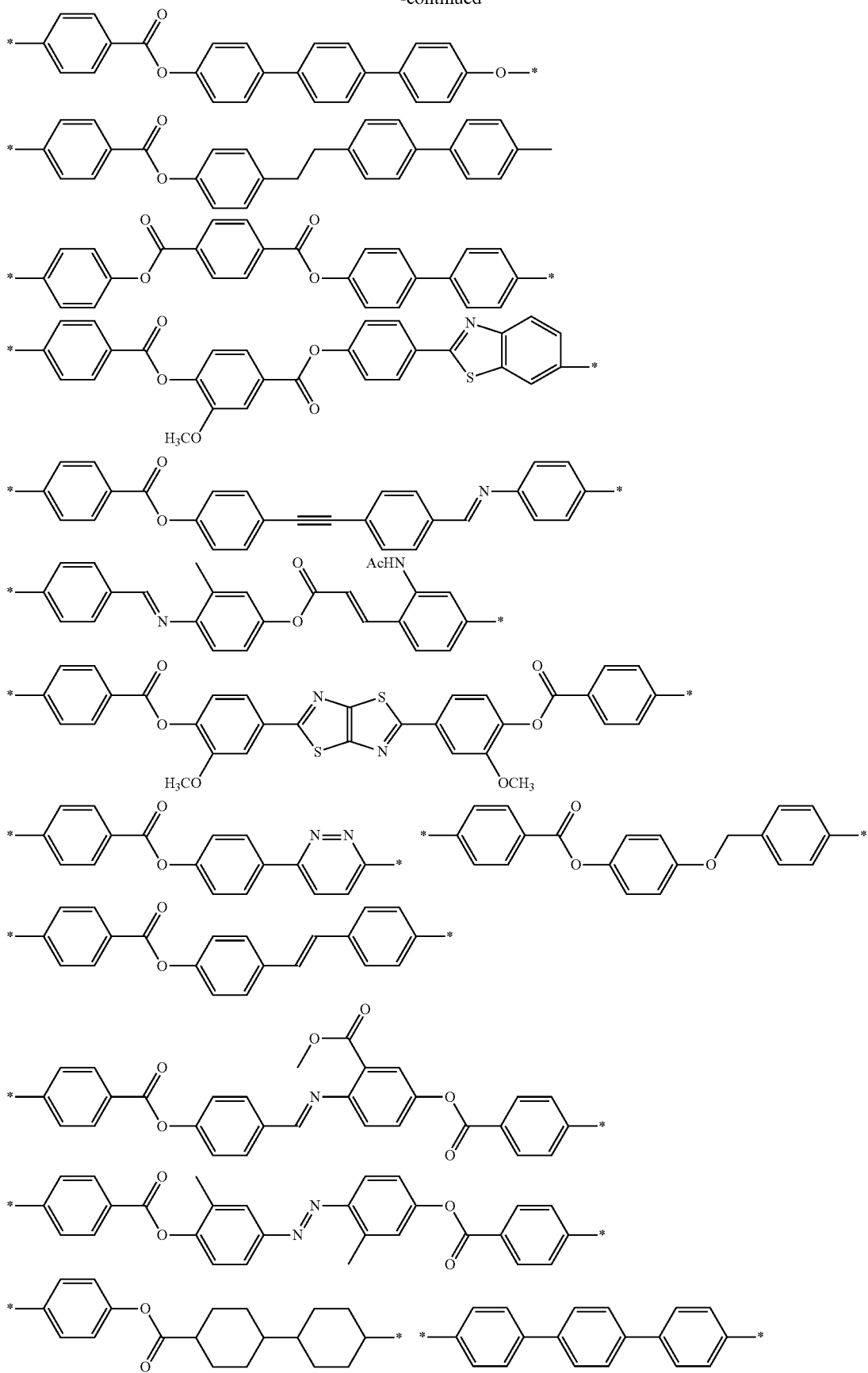

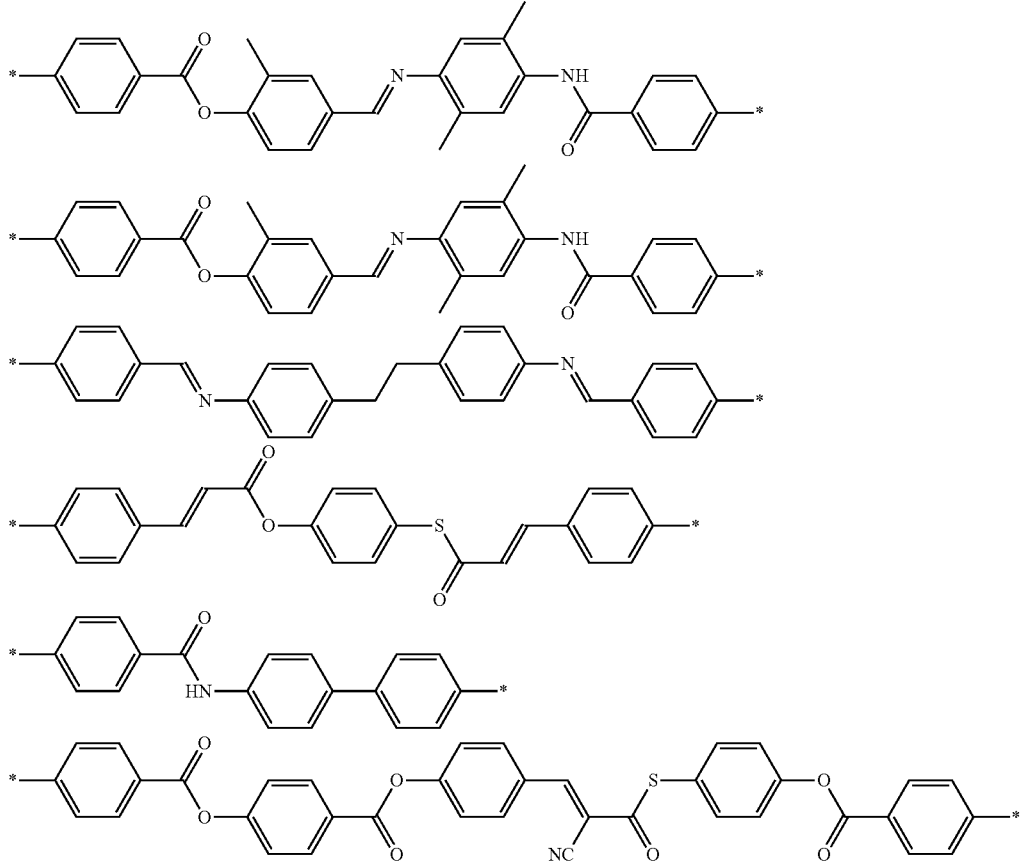

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group, specific examples of the linking group are the same as those for L1 and SP1 described above, and A represents a (meth)acryloyloxy group).

From the viewpoint that the effects of the present invention are more excellent, T1 represents preferably an alkoxy group having 1 to 10 carbon atoms, more preferably an alkoxy group having 1 to 5 carbon atoms, and particularly preferably a methoxy group. These terminal groups may be further substituted with these groups or the above-described crosslinkable groups.

From the viewpoint that the effects of the present invention are more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the degree of alignment of the polarizer is further improved. Here, the "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

From the viewpoint that the effects of the present invention are more excellent, the content of the repeating unit (1L) is preferably in a range of 20% to 100% by mass with respect to 100% by mass of all the repeating units of the polymer liquid crystal compound. In the present invention, the content of each repeating unit contained in the polymer liquid crystal compound is calculated based on the charged amount (mass) of each monomer used for obtaining each repeating unit.

The polymer liquid crystal compound may have only one or two or more kinds of repeating units (1L). Among these, from the viewpoint that the effects of the present invention are more excellent, the polymer liquid crystal compound may have two kinds of the repeating units (1L).

In a case where the polymer liquid crystal compound has two kinds of the repeating units (1L), from the viewpoint that the effects of the present invention are more excellent, it is preferable that the terminal group represented by T1 in one (repeating unit A) is an alkoxy group and the terminal group represented by T1 in the other (repeating unit B) is a group other than the alkoxy group.

From the viewpoint that the effects of the present invention are more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the effects of the present invention are more excellent, the ratio (A/B) of the content of the repeating unit A in the polymer liquid crystal compound to the content of the repeating unit B in the polymer liquid crystal compound is preferably in a range of 50/50 to 95/5, more preferably in a range of 60/40 to 93/7, and still more preferably in a range of 70/30 to 90/10.

Further, the polymer liquid crystal compound may have the repeating unit (1L) and a repeating unit containing no mesogen group. Examples of the repeating unit containing no mesogen group include a repeating unit in which M1 in Formula (1L) represents a single bond.

In a case where the polymer liquid crystal compound has a repeating unit containing no mesogen group, the content of such a repeating unit is preferably greater than 0% by mass and 20% by mass or less with respect to 100% by mass of all the repeating units of the polymer liquid crystal compound.

From the viewpoint that the effects of the present invention are more excellent, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the degree of alignment, the weight-average molecular weight (Mw) of the polymer liquid crystal compound is preferably less than 10000 and more preferably 2000 or greater and less than 10000.

Here, the weight-average molecular weight and the number average molecular weight in the present invention are values measured according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
  Calibration curve: TSK standard polystyrene (manufactured by TOSOH Corporation), calibration curves of 7 samples with Mw of 2800000 to 1050 (Mw/Mn=1.03 to 1.06) are used.

(Low-Molecular-Weight Liquid Crystal Compound)

Examples of the low-molecular-weight liquid crystal compound include liquid crystal compounds described in JP2013-228706A.

(Content of Liquid Crystal Compound)

The content of the liquid crystal compound is preferably in a range of 60% to 95% by mass, more preferably in a range of 70% to 95% by mass, and particularly preferably in a range of 75% to 90% by mass with respect to the total solid content of the present composition. In a case where the content of the liquid crystal compound is in the above-described range, the degree of alignment of the polarizer is further improved.

The content of the polymer liquid crystal compound is preferably in a range of 10% to 95% by mass, more preferably in a range of 30% to 90% by mass, and particularly preferably in a range of 40% to 85% by mass with respect to the total solid content of the present composition. In a case where the content of the liquid crystal compound is in the above-described range, the degree of alignment of the polarizer is further improved.

In a case where the present composition contains a low-molecular-weight liquid crystal compound, the content of the low-molecular-weight liquid crystal compound is preferably greater than 0% by mass and 95% by mass or less, more preferably in a range of 5% to 50% by mass, and particularly preferably in a range of 10% to 40% by mass with respect to the total solid content of the present composition.

It is preferable that the content of the liquid crystal compound, the content of the polymer liquid crystal compound, and the content of the low-molecular-weight liquid crystal compound in the polarizer with respect to the total mass of the polarizer are respectively the same as the content of the liquid crystal compound, the content of the polymer liquid crystal compound, and the content of the low-molecular-weight liquid crystal compound with respect to the total solid content of the present composition described above.

<Dichroic Material>

The composition of the present invention contains a dichroic material. In the present invention, the dichroic material indicates a dye having different absorbances depending on the direction.

The specific dichroic material may or may not exhibit liquid crystallinity. In a case where the specific dichroic material exhibits liquid crystallinity, the specific dichroic material may exhibit any of nematic or smectic liquid crystallinity. The temperature at which the liquid crystal phase is exhibited is preferably in a range of room temperature (approximately 20° C. to 28° C.) to 300° C. and from the viewpoints of handleability and manufacturing suitability, more preferably in a range of 50° C. to 200° C.

In a case where the present composition contains three or more kinds of dichroic materials, at least two kinds of dichroic materials may satisfy the relationship between the log P values described below and the stabilization energy values.

(First Dichroic Material)

The dichroic material in the present invention includes a first dichroic material. The first dichroic material may be used alone or in combination of two or more kinds thereof.

It is preferable that the first dichroic material is a compound having a chromophore which is a nucleus of a dichroic material and a side chain bonded to a terminal of the chromophore.

Specific examples of the chromophore include an aromatic ring group (such as an aromatic hydrocarbon group or an aromatic heterocyclic group) and an azo group. In addition, a structure containing both an aromatic ring group and an azo group is preferable, and a bisazo structure containing an aromatic heterocyclic group (preferably a thienothiazole group) and two azo groups is more preferable.

The side chain is not particularly limited, and examples thereof include a group represented by R1, R2, or R3 in Formula (1).

From the viewpoint of adjusting the tint of the polarizer, it is preferable that the first dichroic material is a dichroic material having a maximum absorption wavelength in a range of 560 nm to 700 nm (more preferably in a range of 560 to 650 nm and particularly preferably in a range of 560 to 640 nm).

The maximum absorption wavelength (nm) of the dichroic material in the present specification is acquired from an ultraviolet visible spectrum in a wavelength range of 380 to 800 nm measured by a spectrophotometer using a solution prepared by dissolving the dichroic material in a good solvent.

From the viewpoints that the degree of alignment of the polarizer is further improved and the effects of the present invention are more excellent, it is preferable that the first dichroic material is a compound represented by Formula (1).

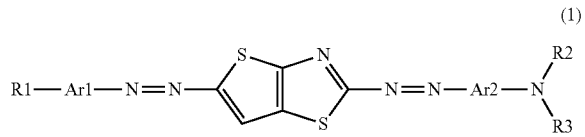

(1)

In Formula (1), Ar1 and Ar2 each independently represent a phenylene group which may have a substituent or a naphthylene group which may have a substituent. Among these, from the viewpoint that the effects of the present invention are more excellent, a phenylene group is preferable.

In Formula (1), R1 represents a hydrogen atom, an alkyl group, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group, which may have a substituent.

Here, examples of the alkyl group having a substituent as R1 include a group in which the carbon atoms of the alkyl group are substituted with —O—, —CO—, —C(O)—O—, —O—C(O)—, —Si(CH$_3$)$_2$—O—Si(CH$_3$)$_2$—, —N(R1')—, —N(R1')-CO—, —CO—N(R1')-, —N(R1')-C(O)—O—, —O—C(O)—N(R1')-, —N(R1')-C(O)—N(R1')—, —CH=CH—, —C≡C—, —N=N—, —C(R1')=CH—C(O)—, or —O—C(O)—O—. One or more carbon atoms or two or more carbon atoms of the alkyl group may be substituted with the above-described group.

The number of carbon atoms in the alkyl group as R1 is preferably in a range of 1 to 20, more preferably in a range of 2 to 18, still more preferably in a range of 4 to 14, and particularly preferably in a range of 8 to 12.

The alkyl group as R1 may have a linear, branched, or cyclic structure, but from the viewpoint that the effects of the present invention are more excellent, a linear structure or a branched structure is preferable, and a linear structure is more preferable.

In a case where R1 represents a group other than a hydrogen atom, the hydrogen atom in each group may be substituted with a halogen atom, a nitro group, a cyano group, —N(R1')$_2$, an amino group, —C(R1')=C(R1')-NO$_2$, —C(R1')=C(R1')-CN, or —C(R1')=C(CN)$_2$. One or more hydrogen atoms or two or more hydrogen atoms of each group may be substituted with the above-described group.

R1' represents a hydrogen atom or a linear or branched alkyl group having 1 to 6 carbon atoms. In a case where a plurality of (R1')'s are present in each group, these may be the same as or different from one another.

In Formula (1), R2 and R3 each independently represent a hydrogen atom, an alkyl group, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, which may have a substituent.

Examples of the alkyl group having a substituent as R2 and R3 include a group in which the carbon atoms of the alkyl group are substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'—, —NR2'-CO—, —CO—NR2'-, —NR2'-C(O)—O—, —O—C(O)—NR2'-, —NR2'-C(O)—NR2'-, —CH=CH—, —C≡C—, —N=N—, —C(R2')=CH—C(O)—, or —O—C(O)—O—. One or more carbon atoms or two or more carbon atoms of the alkyl group may be substituted with the above-described group.

The number of carbon atoms of the alkyl group as R2 and R3 is preferably in a range of 1 to 20, more preferably in a range of 1 to 16, still more preferably 1 to 8, and particularly preferably 1 to 4.

The alkyl group as R2 and R3 may have a linear, branched, or cyclic structure, but from the viewpoint that the effects of the present invention are more excellent, a linear structure or a branched structure is preferable, and a linear structure is more preferable.

In a case where R2 and R3 represent a group other than a hydrogen atom, the hydrogen atom of each group may be substituted with a halogen atom, a nitro group, a cyano group, a —OH group, —N(R2')$_2$, an amino group, —C(R2')=C(R2')-NO$_2$, —C(R2')=C(R2')—CN, or —C(R2')=C(CN)$_2$. One or more hydrogen atoms or two or more hydrogen atoms of each group may be substituted with the above-described group.

R2' represents a hydrogen atom or a linear or branched alkyl group having 1 to 6 carbon atoms. In a case where a plurality of (R2')'s are present in each group, these may be the same as or different from one another.

R2 and R3 may be bonded to each other to form a ring, or R2 or R3 may be bonded to Ar2 to form a ring.

From the viewpoint that the effects of the present invention are more excellent, it is preferable that R1 represents an electron-withdrawing group and that R2 and R3 represent a group with a low electron-donating property.

Specific examples of the group in which R1 represents an electron-withdrawing group include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and an alkyl group in which carbon atoms are substituted with —C(O)—O— and —O—, as R1. As the alkyl group in which carbon atoms are substituted with —C(O)—O— and —O—, a group represented by R11-C(O)—O—R12-O— is preferable. R11 represents a linear or branched alkyl group having 1 to 6 carbon atoms (preferably 1 to 3 carbon atoms), and R12 represents a linear or branched alkylene group having 1 to 20 carbon atoms (preferably 2 to 18 carbon atoms).

Specific examples of the group in which R2 and R3 represent a group having a low electron-donating property include groups having the following structures. In addition, the groups having the following structures are shown in the form having a nitrogen atom to which R2 and R3 are bonded in Formula (1).
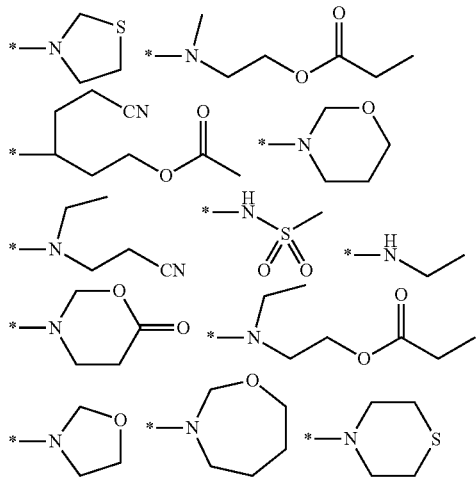
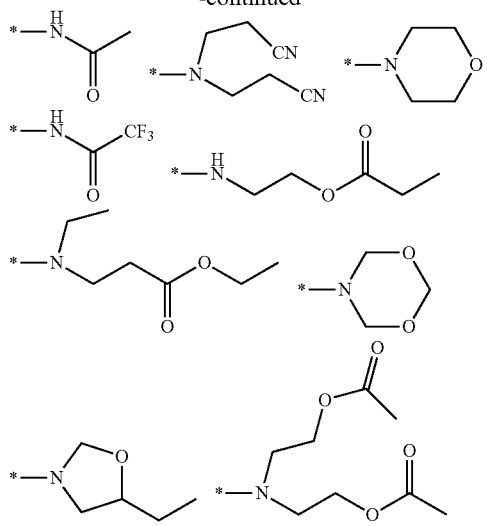
Specific examples of the first dichroic material are shown below, but the present invention is not limited thereto.
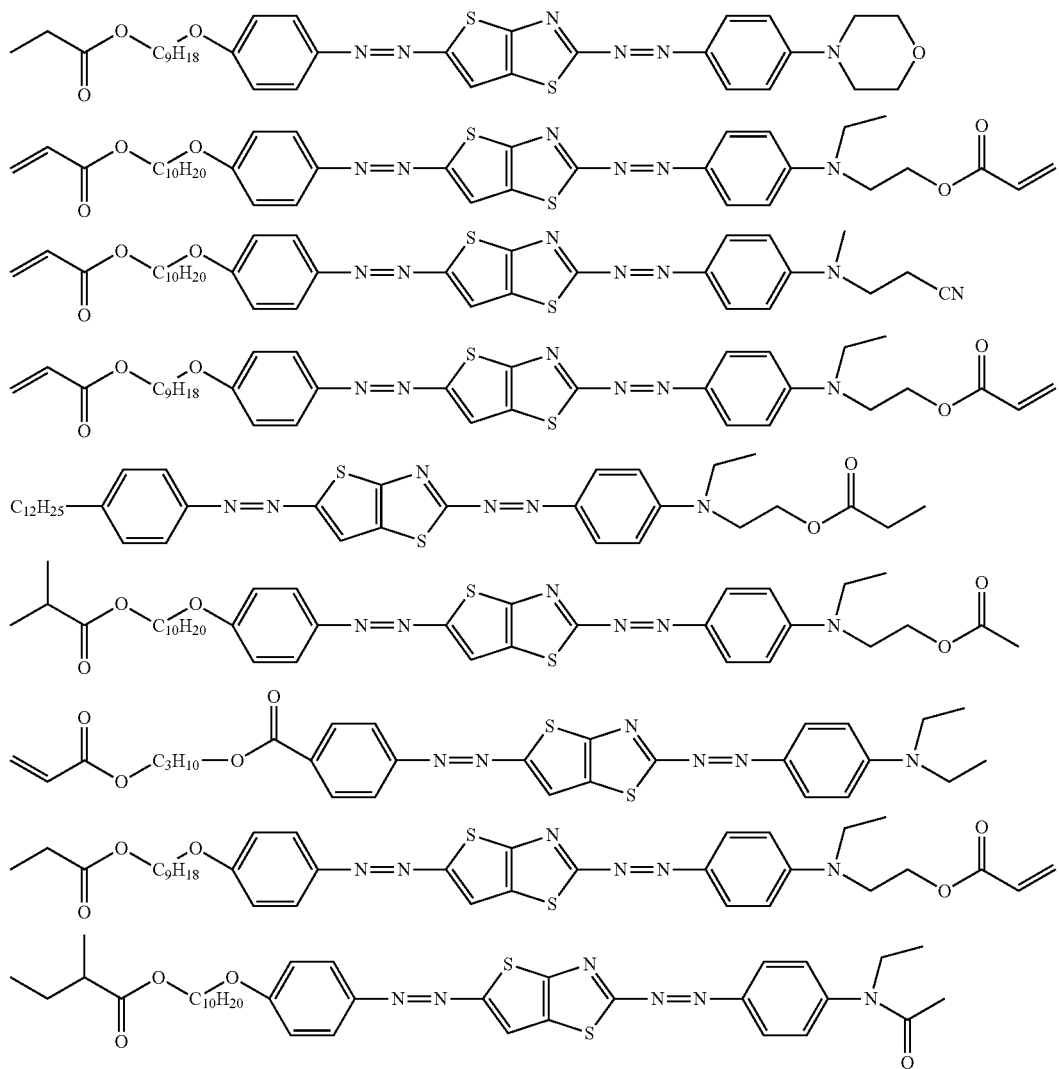

-continued
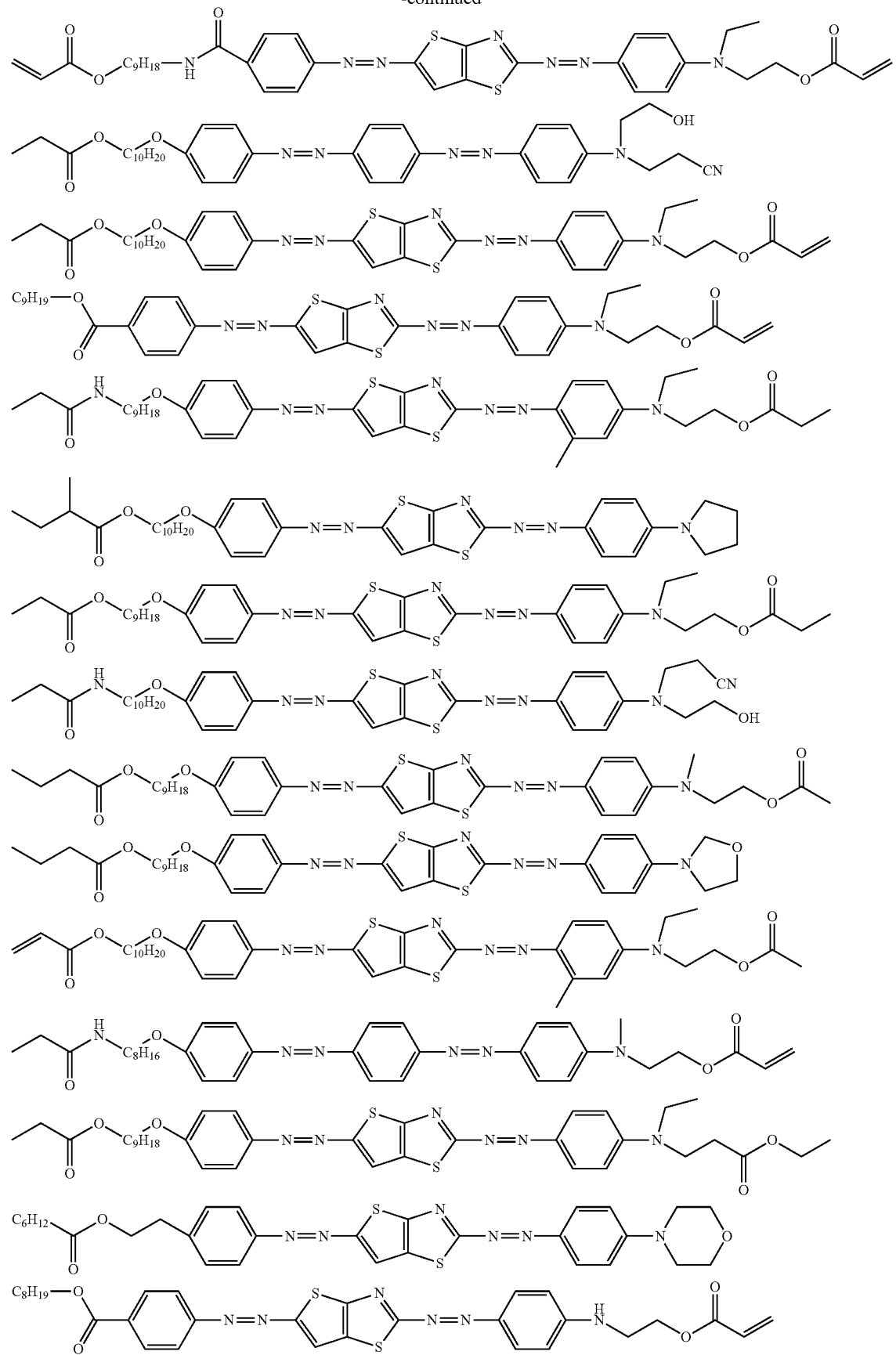

-continued

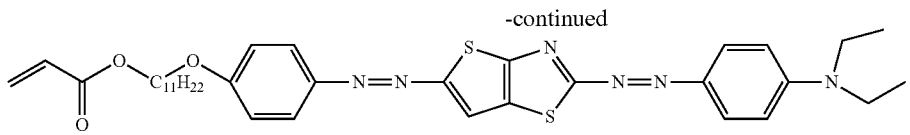

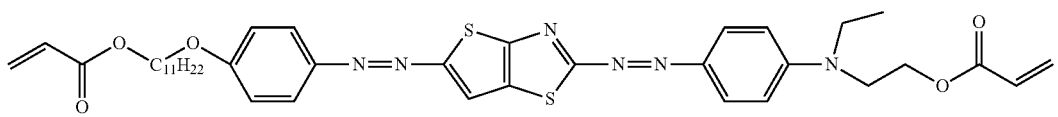

(Second Dichroic Material)

The present composition contains a second dichroic material. The second dichroic material may be used alone or in combination of two or more kinds thereof.

The second dichroic material is a compound different from the first dichroic material. Specifically, the chemical structure of the second dichroic material is different from the chemical structure of the first dichroic material.

It is preferable that the second dichroic material is a compound having a chromophore which is a nucleus of a dichroic material and a side chain bonded to a terminal of the chromophore.

Specific examples of the chromophore include an aromatic ring group (such as an aromatic hydrocarbon group or an aromatic heterocyclic group) and an azo group. Among these, a structure containing both an aromatic hydrocarbon group and an azo group is preferable, a bisazo or trisazo structure containing an aromatic hydrocarbon group and two or three azo groups is more preferable, and from the viewpoint that the effects of the present invention are more excellent, a bisazo structure containing an aromatic hydrocarbon group and two azo groups is particularly preferable.

The side chain is not particularly limited, and examples thereof include a group represented by R4, R5, or R6 in Formula (2).

From the viewpoint of adjusting the tint of the polarizer, it is preferable that the second dichroic material is a dichroic material having a maximum absorption wavelength in a range of 455 nm to 560 nm (more preferably in a range of 455 to 555 nm and particularly preferably in a range of 455 to 550 nm).

In particular, the tint of the polarizer can be more easily adjusted in a case of using the first dichroic material having a maximum absorption wavelength of 560 to 700 nm and the second dichroic material having a maximum absorption wavelength of 455 nm or greater and less than 560 nm.

From the viewpoint that the degree of alignment of the polarizer is further improved and the effects of the present invention are more excellent, it is preferable that the second dichroic material is a compound represented by Formula (2).

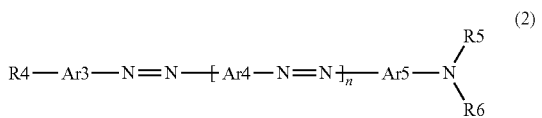

In Formula (2), n represents 1 or 2 and preferably 1 from the viewpoint that the effects of the present invention are more excellent.

In Formula (2), Ar3, Ar4, and Ar5 each independently represent a phenylene group which may have a substituent, a naphthylene group which may have a substituent, or a heterocyclic group which may have a substituent and preferably a phenylene group which may have a substituent from the viewpoint that the effects of the present invention are more excellent.

The heterocyclic group may be aromatic or non-aromatic.

Examples of the atoms other than the carbon atom constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

In Formula (2), R4 has the same definition as that for R1 in Formula (1).

In Formula (2), R5 and R6 each have the same definition as that for R2 and R3 in Formula (1).

From the viewpoint of the durability, it is preferable that R4 represents an electron-withdrawing group and R5 and R6 represent a group having a low electron-donating property.

Among such groups, specific examples of the electron-withdrawing group as R4 are the same as the specific examples of the electron-withdrawing group as R1, and specific examples of the group having a low electron-donating property as R5 and R6 are the same as the specific examples of the group having a low electron-donating property as R2 and R3.

In particular, it is preferable that at least one of R5 or R6 represents a methyl group or an ethyl group, more preferable that at least one of R5 or R6 represents a methyl group from the viewpoint that the effects of the present invention are more excellent, and particularly preferable that only one of R5 or R6 represents a methyl group.

Specific examples of the second dichroic material are described below, but the present invention is not limited thereto.

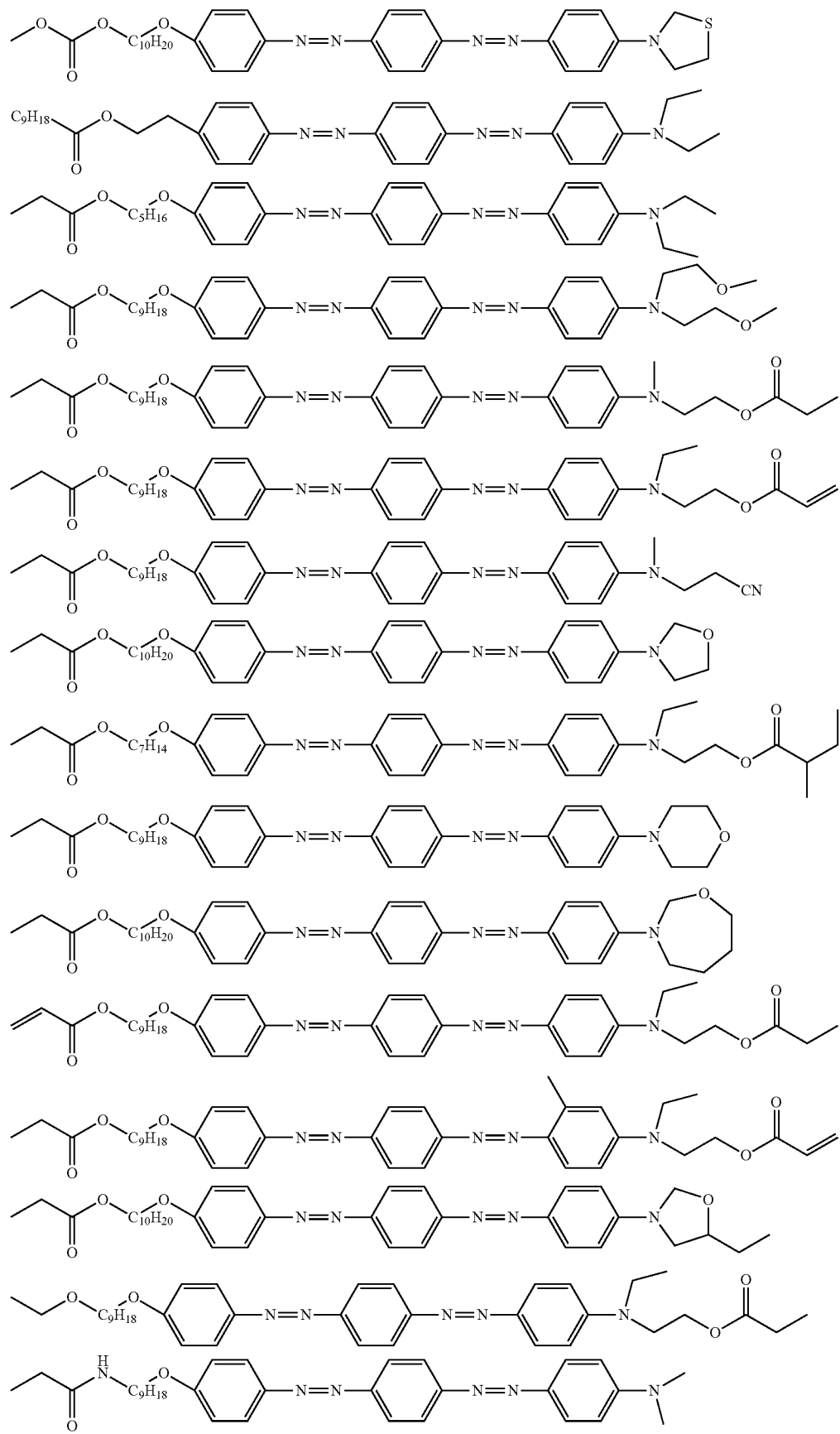

-continued
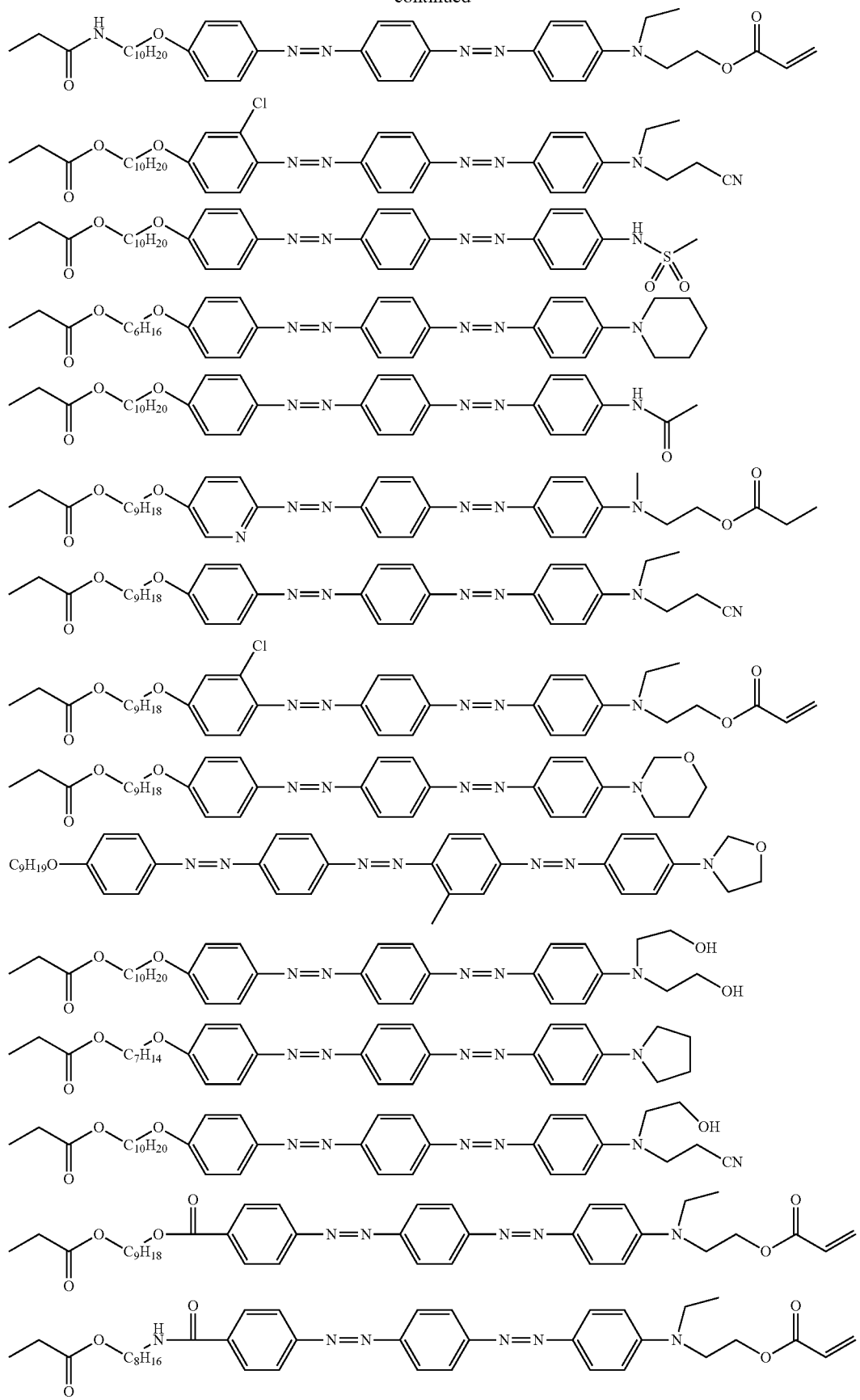

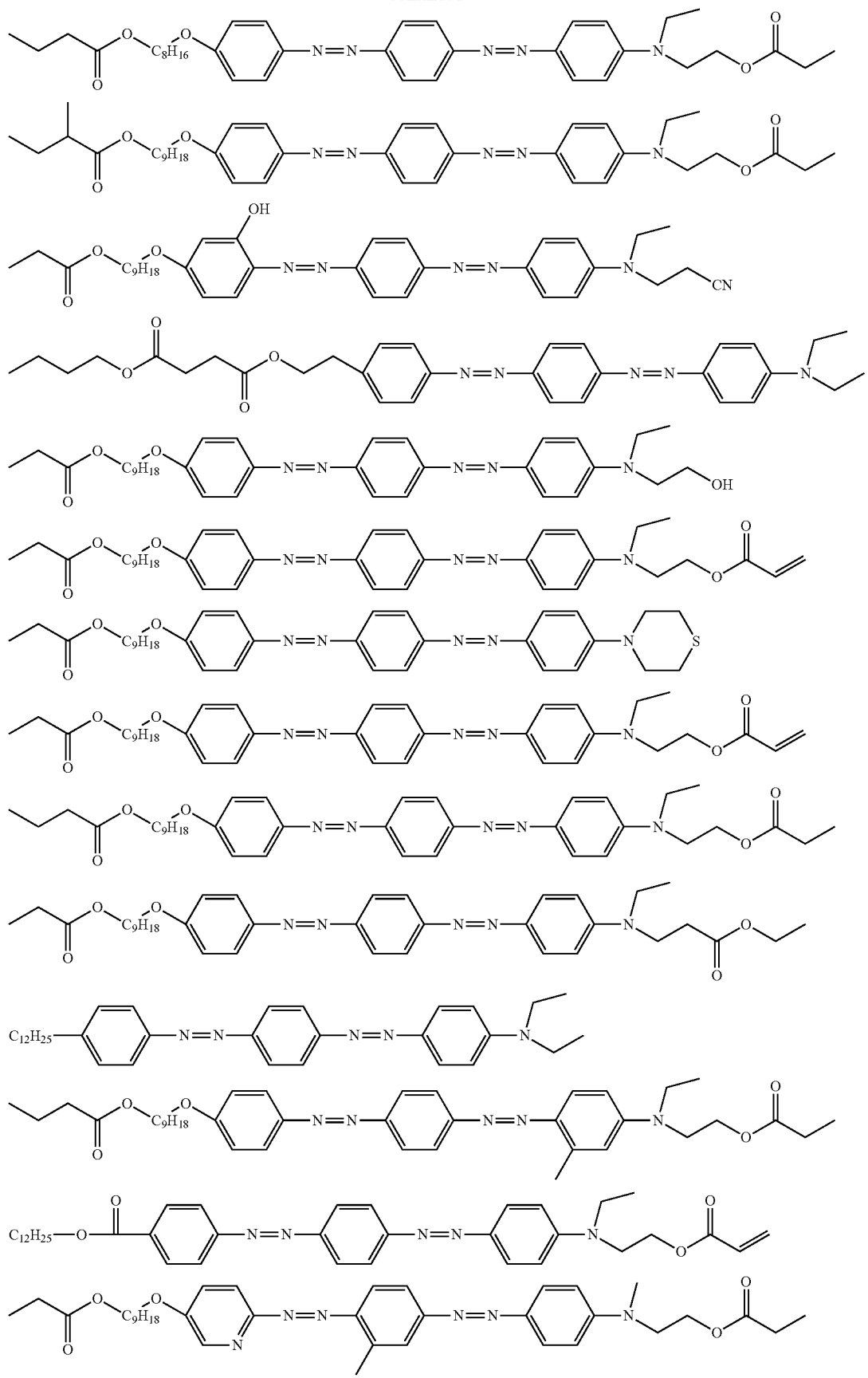

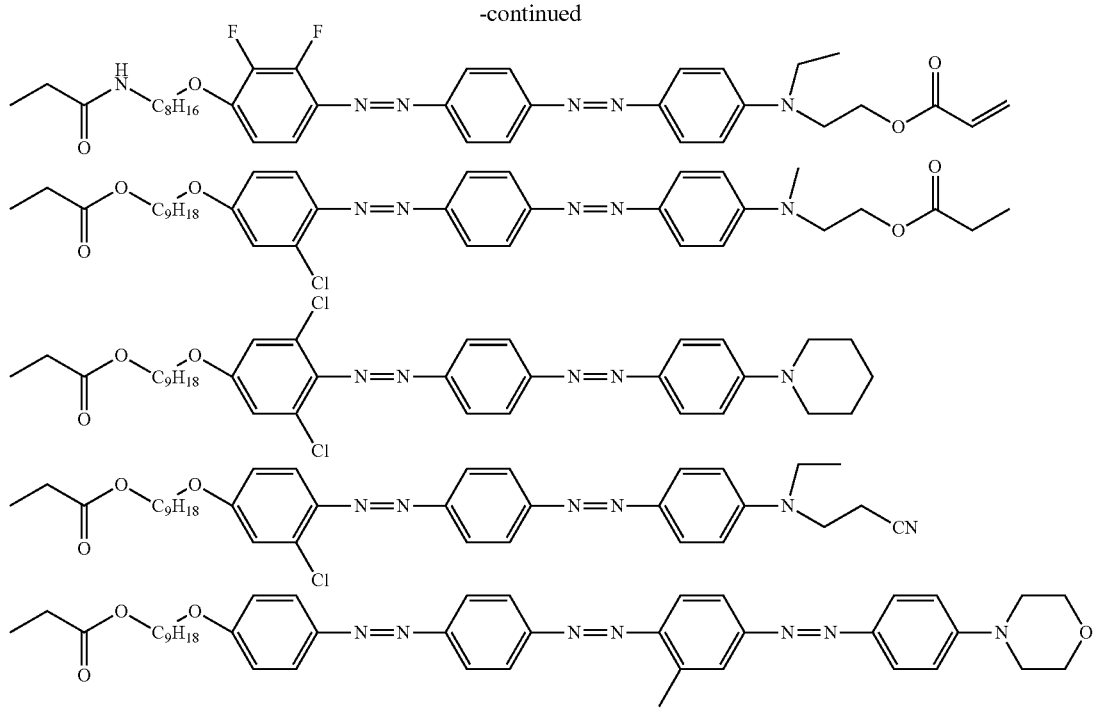

(Third Dichroic Material)

It is preferable that the present composition contains a third dichroic material. The third dichroic material is a dichroic material other than the first dichroic material and the second dichroic material. Specifically, the chemical structure of the third dichroic material is different from the chemical structures of the first dichroic material and the second dichroic material. It is advantageous that the present composition contains the third dichroic material in terms that the tint of the polarizer can be easily adjusted.

The maximum absorption wavelength of the third dichroic material is preferably 380 nm or greater and less than 455 nm and more preferably in a range of 385 to 454 nm. Specific examples of the third dichroic material include compounds other than the first dichroic material and the second dichroic material among the compounds represented by Formula (1) described in WO2017/195833A.

(Difference in Log P Value)

The absolute value of a difference between the log P value of the first dichroic material and the log P value of the second dichroic material (hereinafter, also referred to as the "log P difference") is 1.0 or less, and from the viewpoint that the effects of the present invention are more excellent, the absolute value thereof is preferably 0.5 or less and more preferably 0.4 or less.

In a case where at least one condition selected from a condition that the first dichroic material is a compound represented by Formula (1), a condition that the second dichroic material is a compound represented by Formula (2), a condition that the first dichroic material has a maximum absorption wavelength in a range of 560 nm or greater and 700 nm or less, or a condition that the second dichroic material has a maximum absorption wavelength in a range of 455 nm or greater and less than 560 nm, from the viewpoint that the effects of the present invention are more excellent, it is preferable that the log P value of the first dichroic material is greater than the log P value of the second dichroic material.

From the viewpoint that the effects of the present invention are more excellent, the log P value of the first dichroic material is preferably in a range of 1.0 to 13.0, more preferably in a range of 8.0 to 12.0, and particularly preferably in a range of 9.5 to 11.0. From the viewpoint that the effects of the present invention are more excellent, the log P value of the second dichroic material is preferably in a range of 1.0 to 13.0, more preferably in a range of 8.0 to 12.0, and particularly preferably in a range of 9.5 to 11.0.

Here, the log P value is an index for expressing the properties of the hydrophilicity and hydrophobicity of a chemical structure and is also referred to as a hydrophilic-hydrophobic parameter. The log P value can be calculated using software such as ChemBioDrawUltra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

(Content of Dichroic Material)

From the viewpoint that the effects of the present invention are more excellent, the content of the dichroic material in the present composition is preferably 5% by mass or more, more preferably in a range of 5% to 40% by mass, still more preferably in a range of 5% to 30% by mass, and particularly preferably in a range of 5% to 25% by mass with respect to the total solid content of the present composition.

From the viewpoint that the effects of the present invention are more excellent, the content of the first dichroic material in the present composition is preferably in a range of 1% to 40% by mass, more preferably in a range of 1% to 20% by mass, and particularly preferably in a range of 1% to 10% by mass with respect to the total solid content of the present composition.

From the viewpoint that the effects of the present invention are more excellent, the content of the second dichroic material in the present composition is preferably in a range of 1% to 40% by mass, more preferably in a range of 1% to 20% by mass, and particularly preferably in a range of 1% to 10% by mass with respect to the total solid content of the present composition.

In a case where the present composition contains a third dichroic material, the content of the third dichroic material in the present composition is preferably in a range of 1% to 40% by mass, more preferably in a range of 1% to 20% by mass, and particularly preferably in a range of 1% to 10% by mass with respect to the total solid content of the present composition.

Further, the content of the dichroic materials indicates the total amount of the first dichroic material and the second dichroic material. In a case where the present composition contains the third dichroic material, the content of the third dichroic material is included in the total amount.

The content ratio of the first dichroic material, the second dichroic material, and the third dichroic material used as necessary can be optionally set in order to adjust the tint of the polarizer. Here, from the viewpoint that the effects of the present invention are more excellent, the content ratio of the second dichroic material to the first dichroic material (second dichroic material/first dichroic material) is preferably in a range of 0.1 to 10, more preferably in a range of 0.2 to 5, and particularly preferably in a range of 0.3 to 0.8 in terms of the molar ratio. It is considered that in a case where the content ratio of the second dichroic material to the first dichroic material is in the above-described range, the first dichroic material and the second dichroic material are likely to form an aggregate and/or a crystal structure.

From the viewpoint that the effects of the present invention are more excellent, it is preferable that the content of the dichroic material, the content of the first dichroic material, the content of the second dichroic material, and the content of the third dichroic material in the polarizer with respect to the total mass of the polarizer are respectively the same as the content of the dichroic material, the content of the first dichroic material, the content of the second dichroic material, and the content of the third dichroic material with respect to the total solid content of the present composition described above.

From the viewpoint that the effects of the present invention are more excellent, it is preferable that the content ratio of the second dichroic material to the first dichroic material (second dichroic material/first dichroic material) in the polarizer is the same as the content ratio of the second dichroic material to the first dichroic material in the present composition.

<Solvent>

From the viewpoint of workability and the like, it is preferable that the present composition contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, tetrahydropyran, dioxolane, tetrahydrofurfuryl alcohol, and cyclopentyl methyl ether), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, butyl acetate, and diethyl carbonate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, N-ethylpyrrolidone, and 1,3-dimethyl-2-imidazolidinone), and heterocyclic compounds (such as pyridine), and water. These solvents may be used alone or in combination of two or more kinds thereof.

Among these solvents, it is preferable to use an organic solvent and more preferable to use halogenated carbons or ketones from the viewpoint that the effects of the present invention are more excellent.

In a case where the present composition contains a solvent, the content of the solvent is preferably in a range of 70% to 99.5% by mass, more preferably in a range of 80% to 99% by mass, and particularly preferably in a range of 85% to 98% by mass with respect to the total mass of the present composition from the viewpoint that the effects of the present invention are more excellent.

<Interface Improver>

It is preferable that the present composition contains an interface improver. In a case where the composition contains an interface improver, the smoothness of the coated surface is improved, the degree of alignment is improved, and cissing and unevenness are suppressed so that the in-plane uniformity is expected to be improved.

As the interface improver, interface improvers that allow liquid crystal compounds to be horizontally aligned are preferable, and compounds (horizontal alignment agents) described in paragraphs [0253] to [0293] of JP2011-237513A can be used. Further, fluorine (meth)acrylate-based polymers described in [0018] to [0043] of JP2007-272185A can also be used. Compounds other than the compounds described above may be used as the interface improver.

In a case where the present composition contains an interface improver, from the viewpoint that the effects of the present invention are more excellent, the content of the interface improver in the present composition is preferably in a range of 0.1% to 2.0% by mass and more preferably in a range of 0.1% to 1.0% by mass with respect to the total solid content of the present composition.

In a case where the polarizer contains an interface improver, it is preferable that the content of the interface improver with respect to the total mass of the polarizer is the same as the content of the interface improver with respect to the total solid content of the present composition.

<Polymerization Initiator>

From the viewpoint that the effects of the present invention are more excellent, it is preferable that the present composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), and acylphosphine oxide compounds (JP1988-40799B (JP-S63-40799B), JP1993-29234B (JP-H05-29234B), JP1998-95788A (JP-H10-95788A), and JP1998-29997A (JP-H10-29997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the present composition contains a polymerization initiator, from the viewpoint that the effects of the present invention are more excellent, the content of the polymerization initiator is preferably in a range of 0.1% to 6% by mass and more preferably in a range of 0.5% to 4% by mass with respect to the total solid content of the present composition.

<Substituent>

The substituents in the present specification indicate the following groups unless otherwise specified.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a morpholino group, a maleimide group, a benzoxazolyl group, a benzimidazolyl group, and a benzthiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a carboxy group, a sulfonic acid group, and a phosphoric acid group.

[Stabilization Energy]

The stabilization energy indicates the energy loss (energy difference) in a case where one dichroic material between the first dichroic material and the second dichroic material enters the structure in which the other dichroic material is independently arranged. Since the other dichroic material is likely to enter the structure as the value decreases due to the reason that the loss is small. Therefore, the alignment structure is considered to be easily formed. The following method is exemplified as an example of a method of calculating the above-described stabilization energy.

The stabilization energy can be calculated using calculation software capable of calculating a molecular force field such as AMBER11 that is commercially available. More specifically, using the crystal structure information of one dichroic material (hereinafter, also referred to as a "dichroic material A") obtained by a crystal structure analysis method such as XRD, the stabilization energy is calculated as the energy in a case of replacing one molecule with the other dichroic material (hereinafter, also referred to as a "dichroic material B") from a super cell containing a plurality of unit cells based on the structure optimization calculation. Here, as the super cell, a cell containing the dichroic material A present in a range of 10 Å or greater from the center of gravity starting from the center of gravity of one molecule of the dichroic material A present at the replacement position.

The force field information referred to as General AMBER Force Field (GAFF) and charge information referred to as Restrained Electro Static Potential (RESP) are used as the calculation conditions. Here, GAFF can be set using software such as AmberTools bundled with AMBER11, and RESP can be set by calculating each molecule of the dichroic material under conditions of HF/6-31G(d) using software such as Gaussian09 that is commercially available and allowing AmberTools to read the results. Specifically, the stabilization energy is calculated as a value (X1−X2) obtained by subtracting a sum X2 of the "energy of the super cell formed of only the dichroic material A before being replaced with one molecule of the dichroic material B" and the "energy of one molecule of the dichroic material B" from a sum X1 of the "energy in a state in which one molecule of the dichroic material A in the super cell of the dichroic material A is replaced with one molecule of the dichroic material B" and the "energy of one molecule of the dichroic material A" obtained using the above-described calculation conditions.

The stabilization energy (X1−X2) calculated by the above-described method is 30 kcal/mol or less, and is preferably 25 kcal/mol or less and more preferably 20 kcal/mol or less from the viewpoint that the effects of the present invention are more excellent. Further, the lower limit of the stabilization energy is preferably 0 kcal/mol or greater.

Further, from the viewpoint that the alignment structure of the first dichroic material and the second dichroic material is easily formed and thus a polarizer having a higher degree of alignment is obtained and from the viewpoint that the effects of the present invention are more excellent, the ratio (X1/X2) of the above-described sum X1 to the above-described sum X2 (hereinafter, also referred to as the "stabilization energy ratio") is preferably 0.6 or greater and more preferably 0.8 or greater.

[Method of Producing Polarizer]

The method of producing the polarizer according to the embodiment of the present invention is not particularly limited, but a method comprising a step of forming a coating film by coating an alignment film with the above-described present composition (hereinafter, also referred to as a "coating film forming step") and a step of aligning a dichroic material contained in the coating film (hereinafter, also referred to as an "aligning step") in this order (hereinafter, also referred to as the "present production method") is preferable from the viewpoint that the degree of alignment of the polarizer to be obtained is increased.

Hereinafter, each step will be described.

<Coating Film Forming Step>

The coating film forming step is a step of forming a coating film by coating the alignment film with the above-described present composition. The liquid crystal compound in the coating film is horizontally aligned due to an interaction between the alignment film and an interface improver (in a case where the present composition contains an interface improver).

The alignment film can be easily coated with the present composition of the present invention by using the composition of the present invention which contains the above-described solvent or using a liquid such as a melt obtained by heating the composition of the present invention.

Examples of the method of coating the alignment film with the present composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Alignment Film)

An alignment film may be any film as long as the film allows the liquid crystal compound contained in the present composition to be horizontally aligned.

An alignment film can be provided by means such as a rubbing treatment performed on a film surface of an organic compound (preferably a polymer), oblique vapor deposition of an inorganic compound, formation of a layer having microgrooves, or accumulation of an organic compound (such as w-tricosanoic acid, dioctadecylmethylammonium chloride, or methyl stearylate) according to a Langmuir-Blodgett method (LB film). Further, an alignment film in which an alignment function is generated by application of an electric field, application of a magnetic field, or irradiation with light is also known. Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(1) Rubbing Treatment Alignment Film

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 1 μm.

(2) Photo-Alignment Film

A photo-alignment material used for an alignment film formed by irradiation with light is described in a plurality of documents. In the present invention, preferred examples thereof include azo compounds described in JP2006-285197A, JP2007-76839A, JP2007-138138A, JP2007-94071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, polyamides, or esters are more preferable.

The photo-alignment film formed of the above-described material is irradiated with linearly polarized light or non-polarized light to produce a photo-alignment film.

In the present specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic material polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0° to 900 (vertical) and more preferably in a range of 40° to 90°.

In a case where light to be applied is non-polarized light, the alignment film is irradiated with non-polarized light obliquely. The incidence angle is preferably in a range of 100 to 80°, more preferably in a range of 20° to 60°, and particularly preferably in a range of 30° to 500.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

<Aligning Step>

The aligning step is a step of aligning the dichroic material contained in the coating film. In this manner, the polarizer according to the embodiment of the present invention is obtained. In the aligning step, the dichroic material is considered to be aligned along the liquid crystal compound aligned by the alignment film.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the dichroic material contained in the present composition may be aligned by performing the above-described coating film forming step or drying treatment. For example, in an embodiment in which the present composition is prepared as a coating solution containing a solvent, the polarizer according to the embodiment of the present invention may be obtained by drying the coating film and removing the solvent from the coating film so that the dichroic material contained in the coating film is aligned.

It is preferable that the aligning step includes a heat treatment. In this manner, the dichroic material contained in the coating film is further aligned, and the degree of alignment of the polarizer to be obtained is further increased.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the dichroic material contained in the coating film is further fixed, and the degree of alignment of the polarizer to be obtained is further increased. The cooling means is not particularly limited and can be performed according to a known method.

The polarizer according to the embodiment of the present invention can be obtained by performing the above-described steps.

[Other Steps]

The present production method described below may include a step of curing the polarizer after the aligning step (hereinafter, also referred to as a "curing step").

The curing step is performed by, for example, heating the film and/or irradiating (exposing) the film with light.

Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

Further, the exposure may be performed under a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate of the present invention includes a base material, an alignment film provided on the base material, and the above-described polarizer according to the embodiment of the present invention provided on the alignment film.

Further, the laminate of the present invention may include a λ/4 plate on the polarizer according to the embodiment of the present invention.

Further, the laminate of the present invention may include a barrier layer between the polarizer according to the embodiment of the present invention and the λ/4 plate.

Hereinafter, each layer constituting the laminate of the present invention will be described.

[Base Material]

The base material can be appropriately selected, and examples thereof include glass and a polymer film. The light transmittance of the base material is preferably 80% or greater. In a case where a polymer film is used as the base material, it is preferable to use an optically isotropic polymer film. As specific examples and preferred embodiments of the polymer, the description in paragraph [0013] of JP2002-22942A can be applied. Further, even in a case of a polymer easily exhibiting the birefringence such as polycarbonate and polysulfone which has been known in the related art, a polymer with the exhibiting property which has been decreased by modifying the molecules described in WO2000/26705A can be used.

[Alignment Film]

The alignment film is as described above, and thus the description thereof will not be repeated.

[Polarizer]

The polarizer according to the embodiment of the present invention is as described above, and thus the description will not be repeated.

[λ/4 Plate]

A "λ/4 plate" is a plate having a λ/4 function, specifically, a plate having a function of converting linearly polarized light having a specific wavelength into circularly polarized light (or converting circularly polarized light into linearly polarized light).

For example, specific examples of a form in which a λ/4 plate has a single-layer structure include a stretched polymer film and a phase difference film in which an optically anisotropic layer having a λ/4 function is provided on a support. Further, specific examples of a form in which a λ/4 plate has a multilayer structure include a broadband λ/4 plate obtained by laminating a λ/4 plate and a λ/2 plate.

The λ/4 plate and the polarizer according to the embodiment of the present invention may be provided by coming into contact with each other, or another layer may be provided between the λ/4 plate and the polarizer according to the embodiment of the present invention. Examples of such a layer include a pressure sensitive adhesive layer or an adhesive layer for ensuring the adhesiveness, and a barrier layer.

[Barrier Layer]

In a case where the laminate of the present invention comprises a barrier layer, the barrier layer is provided between the polarizer according to the embodiment of the present invention and the λ/4 plate. Further, in a case where a layer other than the barrier layer (for example, a pressure sensitive adhesive layer or an adhesive layer) is comprised between the polarizer according to the embodiment of the present invention and the λ/4 plate, the barrier layer can be provided, for example, between the polarizer according to the embodiment of the present invention and the layer other than the barrier layer.

The barrier layer is also referred to as a gas blocking layer (oxygen blocking layer) and has a function of protecting the polarizer according to the embodiment of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Applications]

The laminate of the present invention can be used as a polarizing element (polarizing plate) or the like, for example, as a linear polarizing plate or a circularly polarizing plate.

In a case where the laminate of the present invention does not include an optically anisotropic layer such as the λ/4 plate, the laminate can be used as a linear polarizing plate.

Meanwhile, in a case where the laminate of the present invention includes the λ/4 plate, the laminate can be used as a circularly polarizing plate.

[Image Display Device]

An image display device according to the embodiment of the present invention includes the above-described polarizer according to the embodiment of the present invention or the above-described laminate of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device of the present invention, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As a liquid crystal display device which is an example of the image display device according to the embodiment of the present invention, a form of a liquid crystal display device including the above-described polarizer according to the embodiment of the present invention and a liquid crystal cell is preferably exemplified. A liquid crystal display device including the above-described laminate of the present invention (here, the laminate does not include a λ/4 plate) and a liquid crystal cell is more suitable.

In the present invention, between the polarizing elements provided on both sides of the liquid crystal cell, it is preferable that the laminate of the present invention is used as a front-side polarizing element and more preferable that the laminate of the present invention is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules are substantially horizontally aligned at the time of no voltage application and further twistedly aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystal molecules are substantially vertically aligned at the time of no voltage application. The concept of the liquid crystal cell in a VA mode includes (1) a liquid crystal cell in a VA mode in a narrow sense where rod-like liquid crystal molecules are aligned substantially vertically at the time of no voltage application and substantially horizontally at the time of voltage application (described in JP1990-176625A (JP-102-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, a form of a display device including the above-described polarizer according to the embodiment of the present invention, a λ/4 plate, and an organic EL display panel in this order from the viewing side is suitably exemplified.

A form of a display device including the above-described laminate of the present invention which includes a λ/4 plate and an organic EL display panel in this order from the viewing side is more suitably exemplified. In this case, the laminate is formed such that a base material, an alignment film, the polarizer according to the embodiment of the present invention, a barrier layer provided as necessary, and a λ/4 plate are disposed in this order from the viewing side.

Further, the organic EL display panel is a display panel formed using an organic EL element having an organic light-emitting layer (organic electroluminescence layer) sandwiched between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Synthesis Example 1

A first dichroic material C-1 was synthesized in the following manner.

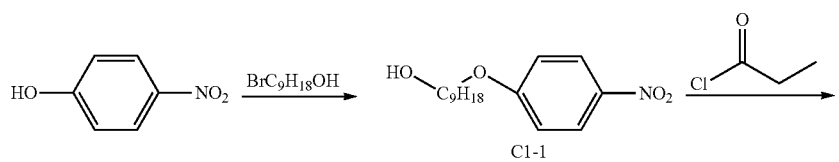

C1-1

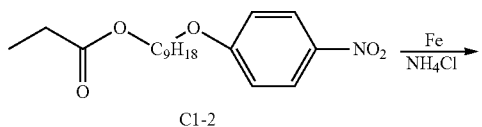

C1-2

-continued

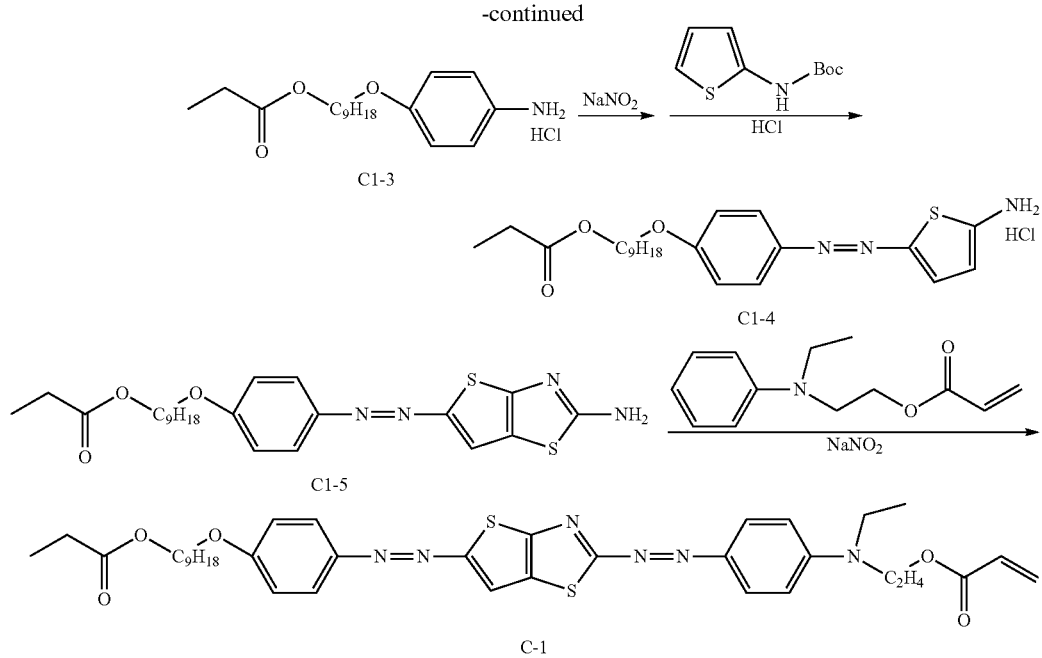

12.6 g of 4-nitrophenol, 20.0 g of 9-bromononanol, and 13.8 g of potassium carbonate were dissolved in 30 ml of N,N-dimethylacetamide (DMAc), and the solution was stirred at an external temperature of 105° C. for 2 hours. The temperature was lowered to room temperature, the solution was subjected to liquid separation and then washed with an ethyl acetate/10% ammonium chloride aqueous solution. The organic layer was dried over magnesium sulfate and then concentrated using a rotary evaporator, thereby obtaining a brown liquid (C1-1).

Next, 25 ml of DMAc was added to the obtained brown liquid (C1-1), and the solution was stirred in an ice bath. The temperature of the reaction system was maintained at 15° C. or lower, 9.5 g of propionic acid chloride was added dropwise thereto, and the resulting solution was stirred at room temperature for 1 hour after the dropwise addition. An ethyl acetate/10% ammonium chloride aqueous solution was added thereto, and the solution was subjected to liquid separation and then washed. The solution was dried over magnesium sulfate and concentrated using a rotary evaporator, thereby obtaining a brown liquid (C1-2).

15.2 g of Fe powder, 7.2 g of ammonium chloride, 20 ml of 2-propanol, and 10 ml of water were mixed and refluxed at an external temperature of 105° C. The brown liquid (C1-2) which had been heated and dissolved in 30 ml of ethyl acetate was added dropwise to the refluxed system. After completion of the dropwise addition, the solution was allowed to react for 30 minutes under reflux. The solution was cooled to room temperature, iron powder was removed by Celite filtration, the filtrate was separated into ethyl acetate and water, and the organic layer was washed with water three times.

The organic layer was concentrated using a rotary evaporator, and 15 ml of tetrahydrofuran (THF) and 15 ml of ethyl acetate were added thereto. A mixed solution of 240 ml of water and 20 ml of concentrated hydrochloric acid was added dropwise to the present solution to obtain 15.3 g of a target (C1-3).

NMR (Nuclear Magnetic Resonance) data (DMSO-d6) δ: 1.03 (t, 3H), 1.25-1.48 (m, 11H), 1.58 (m, 2H), 1.71 (m, 2H), 2.30 (m, 2H), 3.97 (m, 4H), 7.01 (d, 2H), 7.29 (d, 2H), 10.04 (br-s, 3H)

2-Aminothiophene hydrochloride was synthesized by 2-nitrothiophene according to the method described in the document (Journal of Medicinal Chemistry, 2005, Vol. 48, p. 5794).

6.2 g of the target solid (C1-3) obtained in the above-described manner was added to a mixed solution of 15 ml of 12 mol/L hydrochloric acid, 30 ml of water, and 30 ml of THF, the solution was cooled to an internal temperature of 5° C. or lower, and 1.4 g of sodium nitrite was dissolved in 9 ml of water and added dropwise to the solution. The solution was stirred at an internal temperature of 5° C. or lower for 1 hour to prepare a diazonium solution.

Next, 2.4 g of 2-aminothiophene hydrochloride was dissolved in 12 ml of water and 6 ml of hydrochloric acid, and the diazonium solution prepared in the above-described manner was added dropwise at an internal temperature of 0° C. The reaction solution was heated to room temperature and stirred for 2 hours.

The precipitated solid was separated by filtration and dried to obtain 6.3 g of a reddish orange solid (C1-4).

NMR data (DMSO-d6) δ: 1.01 (t, 3H), 1.29-1.40 (m, 11H), 1.55 (m, 2H) 1.69 (m, 2H), 2.29 (m, 2H), 3.17 (s, 2H), 3.97 (m, 4H), 6.88 (br-s, 1H), 6.97 (d, 2H), 7.39 (d, 2H), 7.85 (m, 1H)

Further, in the formula, "Boc" represents a tert-butoxycarbonyl group.

5.6 g of the reddish orange solid (C1-4) obtained in the above-described manner was suspended and dissolved in 100 ml of acetic acid, and 1.5 g of sodium thiocyanate was added thereto at room temperature. 2.0 g of bromine was added dropwise to the solution while the solution was water-cooled and the internal temperature was maintained at 20° C. or lower.

After the resulting solution was stirred at room temperature for 2 hours, 100 ml of water was added thereto, and the obtained solid was separated by filtration and dried, thereby obtaining 5.3 g of a black solid (C1-5).

NMR data (CDCl$_3$) δ: 1.14 (t, 3H), 1.30-1.50 (m, 11H), 1.60 (m, 6H), 1.81 (m, 2H), 2.32 (q, 2H), 4.04 (m, 4H), 5.31 (br, 2H), 6.95 (d, 2H), 7.66 (s, 1H), 7.78 (d, 2H)

4.7 g of the black solid (C1-5) obtained in the above-described manner was added to 6 ml of hydrochloric acid and 6 ml of acetic acid, 5 ml of an aqueous solution containing 0.72 g of sodium nitrite was added dropwise thereto at 0° C. or lower under ice-cooling, the solution was stirred for 1 hour, and 0.52 mg of amidosulfuric acid was added thereto, thereby obtaining a diazonium solution.

The diazonium solution was added dropwise to a 10 ml methanol solution containing 2.2 g of N-ethyl-N-(2-acryloyloxyethyl)aniline while the methanol solution was maintained at 0° C. or lower. After the solution was heated to room temperature and stirred for 1 hour, 30 ml of water was added thereto, and the obtained solid was separated by filtration. The resultant was purified by a column, thereby obtaining 0.6 g of a black-green solid compound (first dichroic material C-1).

Further, N-ethyl-N-(2-acryloyloxyethyl)aniline was synthesized using N-ethylaniline as a raw material according to U.S. Pat. No. 7,601,849B and a known method.

NMR data (solvent: CDCl$_3$) δ: 1.14 (t, 3H), 1.26 (t, 3H), 1.29 (br-s, 811), 1.49 (m, 2H), 1.64 (m, 2H), 1.82 (m, 2H), 2.33 (m, 2H), 3.58 (m, 2H), 3.77 (m, 2H), 4.07 (m, 4H), 4.40 (m, 2H), 5.90 (dd, 1H), 6.15 (dd, 1H), 6.40 (dd, 1H), 6.82 (d, 2H), 7.00 (d, 2H), 7.88 (m, 3H), 7.95 (d, 2H)

Synthesis Example 2

The second dichroic material M-3 was synthesized in the following manner.

at 0° C. to 5° C. After completion of the dropwise addition, the solution was stirred at 0° C. or lower for 1 hour to prepare a diazonium salt solution.

20 ml of methanol was added to 17.5 g of phenol, and the solution was stirred for dissolution. An aqueous solution obtained by dissolving 28.8 g of NaOH in 150 ml of water was added to the solution, and the solution was cooled to 0° C. and stirred. The diazonium salt solution prepared by the above-described method was added dropwise to the solution at 0° C. to 5° C. After completion of the dropwise addition, the solution was stirred at 5° C. for 1 hour and then stirred at room temperature for 1 hour to complete the reaction. Next, an aqueous solution obtained by dissolving 36.0 g of NaOH in 150 ml of water, and the solution was heated under reflux for 3 hours. After completion of the reaction, the solution was cooled to room temperature, the pH thereof was adjusted to 7.0 by adding a hydrochloric acid aqueous solution thereto, and the precipitated crystals were filtered, thereby obtaining 40.2 g of a compound M3-1 (yield: 87.2%, brown crystals).

Further, N-ethyl-N-(2-acryloyloxyethyl)aniline was synthesized using N-ethylaniline as a raw material according to U.S. Pat. No. 7,601,849B and a known method.

100 ml of acetic acid, 10 ml of water, and 20 ml of methanol were added to 5.0 g of the compound M3-1, and the solution was cooled to 0° C. and stirred. 7 ml of concentrated hydrochloric acid was added dropwise to the solution. Next, an aqueous solution obtained by dissolving 1.8 g of sodium nitrite in 5 ml of water was added dropwise thereto. The internal temperature was maintained at 0 to 5° C. After completion of the dropwise addition, the solution was stirred at 0° C. or lower for 1 hour to prepare a diazonium salt solution.

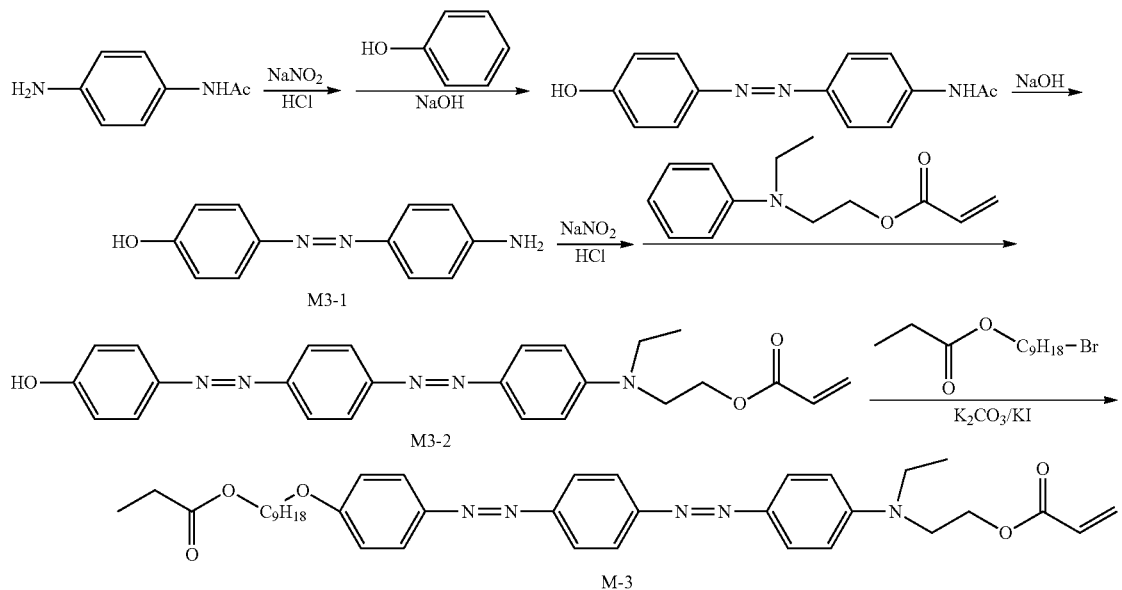

100 ml of water was added to 27 g of p-acetylaminoaniline, and the solution was cooled to 0° C. and stirred. 66 ml of concentrated hydrochloric acid was added dropwise to the solution. Next, an aqueous solution obtained by dissolving 12.5 g of sodium nitrite (manufactured by FUJIFILM Wako Pure Chemical Corporation) in 30 ml of water was added dropwise thereto. The internal temperature was maintained 7.7 g of sodium acetate, 100 ml of methanol, and 100 ml of water were added to 8.4 g of N-ethyl-N-(2-acryloyloxyethyl)aniline synthesized above, and the solution was stirred for dissolution, cooled to 0° C., and stirred. The diazonium salt solution prepared by the above-described method was added dropwise to the solution at 0° C. to 5° C. After completion of the dropwise addition, the solution was stirred at 5° C. for 1 hour and then stirred at room temperature for 1 hour to complete the reaction. The precipitated crystals were separated by filtration, thereby obtaining 6.2 g of a compound M3-2 (yield: 86.8%, brown crystals).

50.0 g of 1-bromononanol was dissolved in 500 ml of ethyl acetate, 26.5 g of triethylamine was added dropwise thereto, and the resulting solution was stirred at 5° C. 22.8 g of propionyl chloride was added dropwise thereto, the solution was stirred at room temperature for 1 hour to complete the reaction. After the completion of the reaction, 175 ml of water was added thereto, the solution was subjected to liquid separation, and 10 g of magnesium sulfate was added to the organic layer for dehydration. The obtained organic layer was concentrated using a rotary evaporator, thereby obtaining 9-bromononyl propionate (52 g, colorless transparent liquid).

72 ml of dimethylacetamide was added to the compound M3-2 (7.2 g), potassium carbonate (7.7 g, 0.014 mmol), and potassium iodide (0.15 g, 0.002 mol), and the solution was heated to 80° C. and stirred. 8.4 g of 9-bromononyl propionate synthesized above was added dropwise to the solution. After the dropwise addition, the solution was heated to 80° C. and stirred for 4 hours to complete the reaction. After the completion of the reaction, the reaction solution was poured into water, and the precipitated crystals were filtered and washed with water. The crystals were separated and purified by silica gel column chromatography (as an eluent, chloroform, and chloroform and ethyl acetate at a ratio of 50/1 were used in this order). Methanol was added to the residues, the precipitated crystals were filtered, and the resultant was washed with methanol and dried. In this manner, 5.5 g of a second dichroic material M-3 (orange crystals) was obtained.

NMR data (CDCl$_3$) δ: 1.13 (t, 3H), 1.25 (t, 3H), 1.29 (br-s, 8H), 1.49 (m, 2H), 1.64 (m, 2H), 1.82 (m, 2H), 2.33 (q, 2H), 2.53 (m, 2H), 2.73 (t, 2H), 4.03 (q, 4H), 4.38 (t, 2H), 5.86 (d, 1H), 6.12 (dd, 1H), 6.43 (d, 1H), 6.83 (d, 2H), 7.00 (d, 2H), 7.94 (m, 8H)

Further, the following second dichroic materials M-1, M-2, M-4, M-5, and M-6 were synthesized with reference to the method of producing the above-described second dichroic material M-3.

Synthesis Example 3

A third dichroic material Y-1 was synthesized in the following manner.

First, 4-hydroxybutyl acrylate (20 g) and mesyl chloride (16.8 g, MsCl) were dissolved in ethyl acetate (90 mL), and triethylamine (16.4 g, NEt$_3$) was added dropwise thereto while the solution was cooled in an ice bath. Thereafter, the resulting solution was stirred at room temperature for 2 hours, and 1 N HCl was added thereto to perform liquid separation. The obtained organic layer was distilled off under reduced pressure, thereby obtaining a compound y1 (30 g) with the following structure.

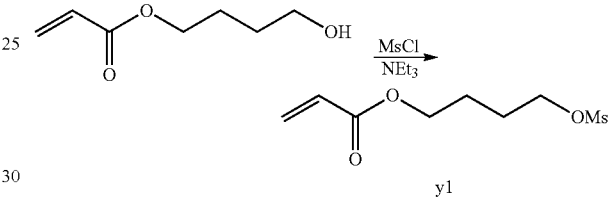

Further, the third dichroic material Y-1 was synthesized according to the following route.

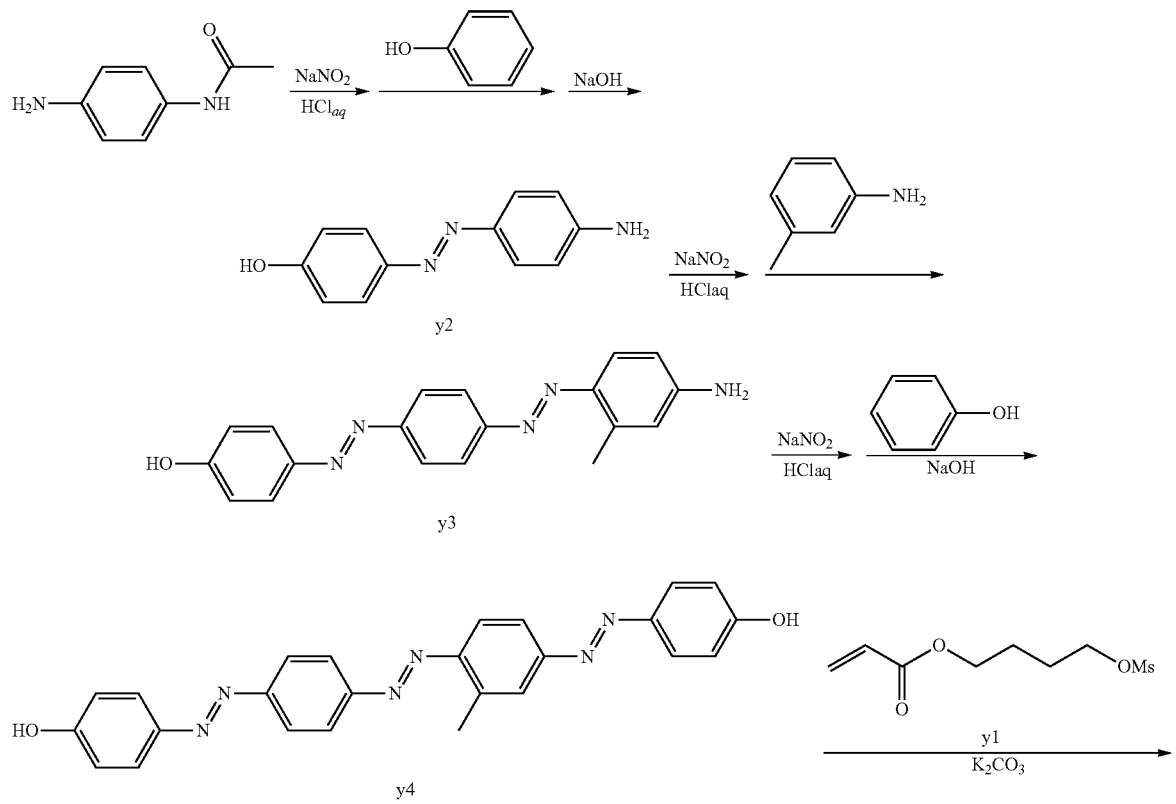

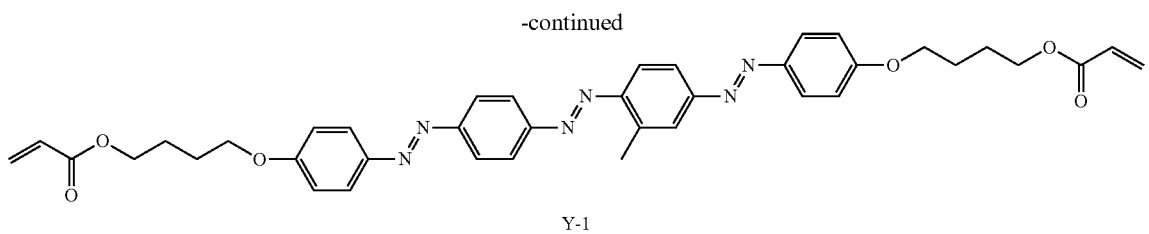

Y-1

First, a compound y2 (10 g) was synthesized according to the literature (Chem. Eur. J. 2004. October 2011).

The compound y2 (10 g) was dissolved in water (300 mL) and hydrochloric acid (17 mL), the solution was cooled in an ice bath, sodium nitrite (3.3 g) was added thereto, and the resulting solution was stirred for 30 minutes. Further, m-toluidine (5.1 g) was added thereto after amidosulfuric acid (0.5 g) was further added thereto, and the solution was stirred at room temperature for 1 hour. After the solution was stirred, the solid obtained by neutralization with hydrochloric acid was collected by suction filtration, thereby obtaining a compound y2 (3.2 g).

The compound y2 (1 g) was dissolved in a THF solution consisting of tetrahydrofuran (30 mL, THF), water (10 mL), and hydrochloric acid (1.6 mL), the solution was cooled in an ice bath, sodium nitrite (0.3 g) was added thereto, the resulting solution was stirred for 30 minutes, and amidosulfuric acid (0.5 g) was further added thereto. Separately, phenol (0.4 g) was dissolved in potassium carbonate (2.76 g) and water (50 mL), the solution was cooled in an ice bath, the above-described THF solution was added dropwise thereto, and the resulting solution was stirred at room temperature for 1 hour. After the solution was stirred, water (200 mL) was added thereto, and the obtained compound y3 (1.7 g) was suction-filtered. The compound y3 (0.6 g), the compound y1 (0.8 g), and potassium carbonate (0.95 g) were dissolved in DMAc (30 mL, dimethylacetamide) and the solution was stirred at 90° C. for 3.5 hours. After the solution was stirred, water (300 mL) was added thereto, the obtained solid was suction-filtered, thereby obtaining a third dichroic material Y-1 (0.3 g).

Example 1

[Preparation of Transparent Support]
<Preparation of Core Layer Cellulose Acylate Dope>

The following composition was put into a mixing tank and stirred to dissolve each component, thereby preparing a cellulose acetate solution used as a core layer cellulose acylate dope.

| Core layer cellulose acylate dope | |
|---|---|
| Cellulose acetate having acetyl substitution degree of 2.88: | 100 parts by mass |
| Polyester compound B described in example of JP2015-227955B: | 12 parts by mass |

| Core layer cellulose acylate dope | |
|---|---|
| Compound F shown below: | 2 parts by mass |
| Methylene chloride (first solvent): | 430 parts by mass |
| Methanol (second solvent): | 64 parts by mass |

Compound F

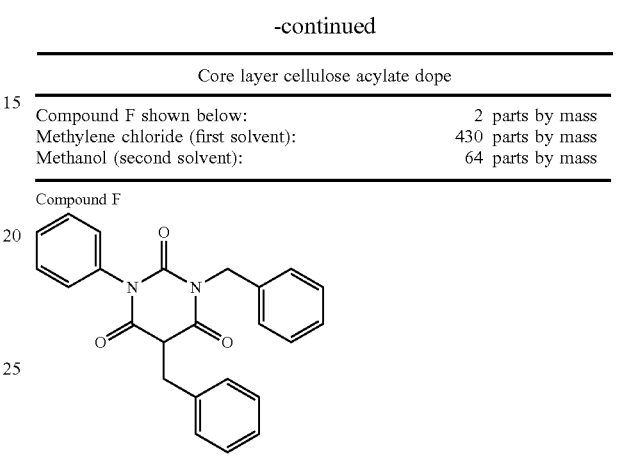

<Preparation of Outer Layer Cellulose Acylate Dope>

10 parts by mass of the following matting agent solution was added to 90 parts by mass of the above-described core layer cellulose acylate dope, thereby preparing a cellulose acetate solution used as an outer layer cellulose acylate dope.

Matting Agent Solution
  Silica particles with average particle size of 20 nm (AEROSIL R972, manufactured by Nippon Aerosil Co., Ltd.): 2 parts by mass
  Methylene chloride (first solvent): 76 parts by mass
  Methanol (second solvent): 11 parts by mass
  Core layer cellulose acylate dope described above: 1 parts by mass <Preparation of Cellulose Acylate Film 1>

The core layer cellulose acylate dope and the outer layer cellulose acylate dope were filtered through filter paper having an average pore size of 34 μm and a sintered metal filter having an average pore size of 10 μm, and three layers which were the core layer cellulose acylate dope and the outer layer cellulose acylate dopes provided on both sides of the core layer cellulose acylate dope were simultaneously cast from a casting port onto a drum at 20° C. (band casting machine).

Next, the film was peeled off in a state where the solvent content was approximately 20% by mass, both ends of the film in the width direction were fixed by tenter clips, and the film was dried while being stretched at a stretching ratio of 1.1 times in the lateral direction.

Thereafter, the film was further dried by being transported between the rolls of the heat treatment device to prepare an optical film (transparent support) having a thickness of 40 μm, and the optical film was used as a cellulose acylate film 1. The in-plane retardation of the obtained cellulose acylate film 1 was 0 nm.

[Preparation of Alignment Film]

The cellulose acylate film 1 was continuously coated with a coating solution PA1 for forming an alignment layer described below with a wire bar. The support on which a coating film was formed was dried with warm air at 140° C. for 120 seconds, and the coating film was irradiated with polarized ultraviolet rays (10 mJ/cm², using an ultra-high pressure mercury lamp) to form a photo-alignment layer PA1, thereby obtaining a triacetyl cellulose (TAC) film provided with a photo-alignment layer. The film thickness thereof was 1.0 μm.

| Coating solution PA1 for forming alignment layer | |
|---|---|
| Polymer PA-1 shown below: | 100.00 parts by mass |
| Acid generator PAG-1 shown below: | 8.25 parts by mass |
| Stabilizer DIPEA shown below: | 0.6 parts by mass |
| Xylene: | 1126.60 parts by mass |
| Methyl isobutyl ketone: | 125.18 parts by mass |

Polymer PA-1

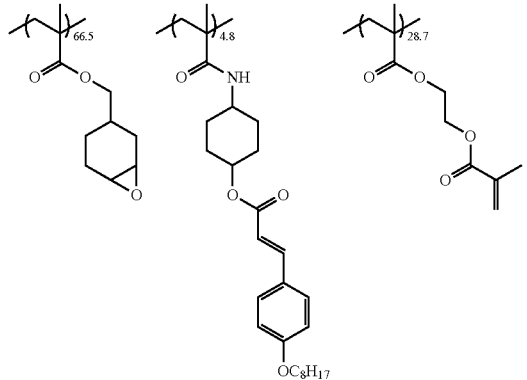

Coating solution PA1 for forming alignment layer

Acid generator PAG-1

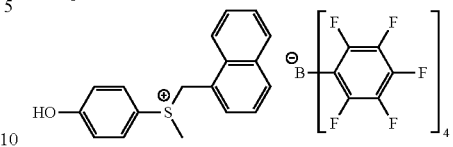

Stabilizer D1PEA

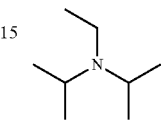

[Preparation of Polarizer P1]

The obtained alignment layer PA1 was continuously coated with the following composition P1 for forming a polarizer with a wire bar to form a coating layer P1. Next, the coating layer P1 was heated at 140° C. for 30 seconds, and the coating layer P1 was cooled to room temperature (23° C.).

Next, the coating layer was heated at 80° C. for 60 seconds and cooled to room temperature again.

Thereafter, the coating layer was irradiated with an LED lamp (center wavelength of 365 nm) for 2 seconds under an irradiation condition of an illuminance of 200 mW/cm², thereby preparing a polarizer P1 on the alignment film PAL. The film thickness of the polarizer P1 was 0.4 μm.

| Composition of composition P1 for forming polarizer | |
|---|---|
| First dichroic material C-1 shown below: | 0.64 parts by mass |
| Second dichroic material M-1 shown below: | 0.42 parts by mass |
| Third dichroic material Y-1 shown below: | 0.39 parts by mass |
| Polymer liquid crystal compound L-1 shown below: | 4.48 parts by mass |
| Polymerization initiator IRGACURE OXE-02 (manufactured by BASF SE): | 0.051 parts by mass |
| Surfactant F-1 shown below: | 0.031 parts by mass |
| Cyclopentanone: | 45.83 parts by mass |
| Tetrahydrofuran: | 45.83 parts by mass |
| Benzyl alcohol: | 2.35 parts by mass |

C-1

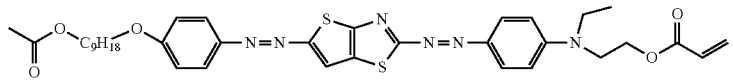

M-1

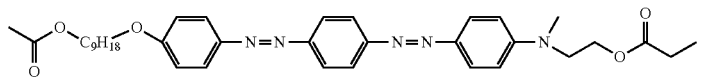

-continued

Composition of composition P1 for forming polarizer

Y-1

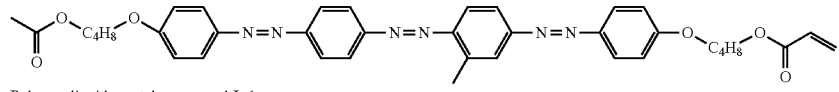

Polymer liquid crystal compound L-1

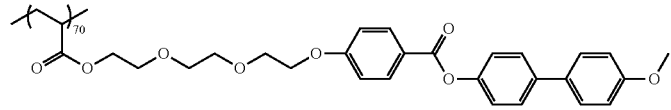

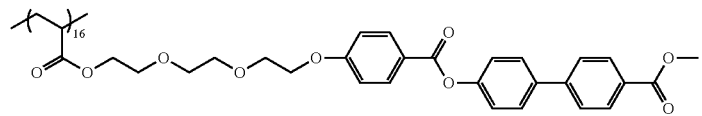

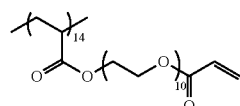

Surfactant F-1

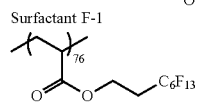

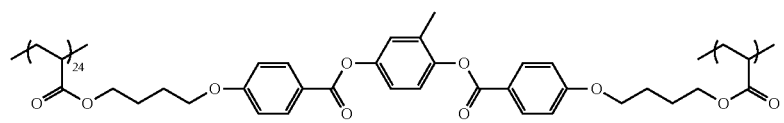

[Preparation of Cured Layer N1]

The obtained polarizer P1 was continuously coated with the following composition N1 for forming a cured layer with a wire bar to form a cured layer N.

Thereafter, the cured layer N1 was dried at room temperature and irradiated using a high-pressure mercury lamp under an irradiation condition of an illuminance of 28 mW/cm$^2$ for 15 seconds, thereby preparing a cured layer N1 on the polarizer P1.

The film thickness of the cured layer N1 was 0.05 μm (50 nm).

Composition of Composition N1 for Forming Cured Layer
  Mixture LM1 of rod-like liquid crystal compounds shown below: 2.61 parts by mass
  Modified trimethylolpropane triacrylate shown below: 0.11 parts by mass
  Photopolymerization initiator I-1 shown below: 0.05 parts by mass
  Interface improver F-3 shown below: 0.21 parts by mass
  Methyl isobutyl ketone: 297 parts by mass
  Mixture LM1 of rod-like liquid crystal positive compounds (the numerical values in the following formulae are on a % by mass basis, and R represents a group bonded with respect to an oxygen atom).

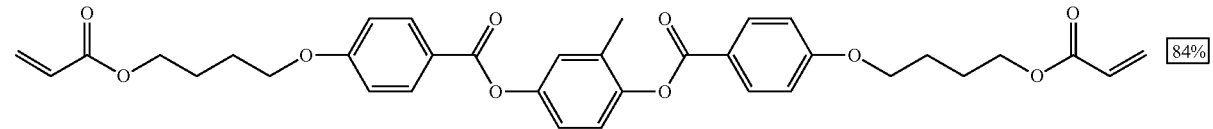

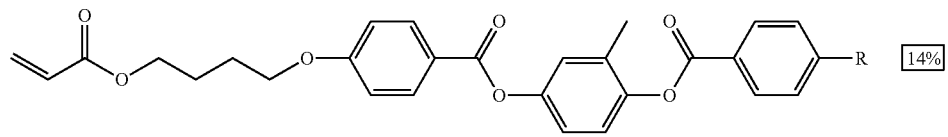

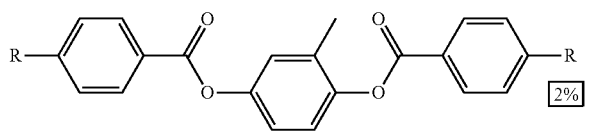   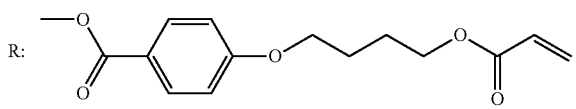

Modified Trimethylolpropane Triacrylate

Modified trimethylolpropane triacrylate

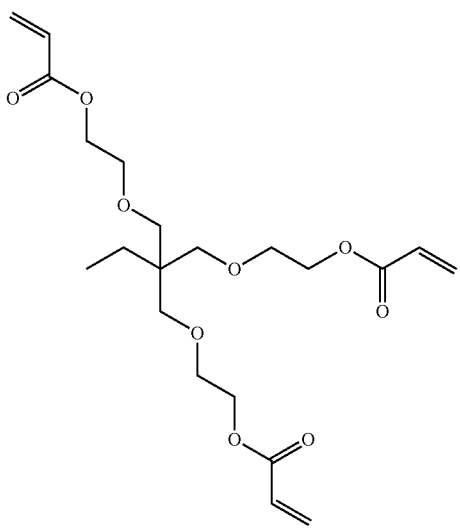 [SMILES: C=CC(=O)OCCOCC(CC)(COCCOC(=O)C=C)COCCOC(=O)C=C]

Photopolymerization initiator I-1 shown below

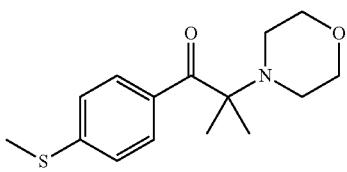 [SMILES: CSc1ccc(C(=O)C(C)(C)N2CCOCC2)cc1]

Surfactant F-3

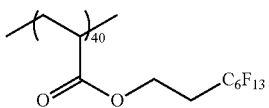

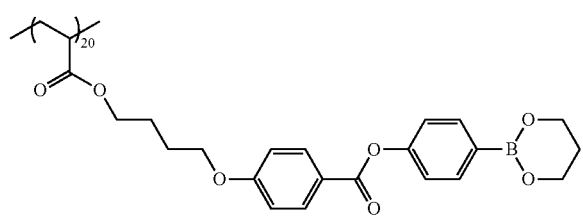

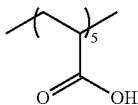

-continued

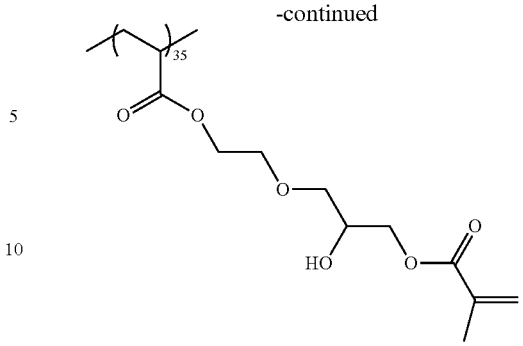

[Formation of Oxygen Blocking Layer B1]

The cured layer N1 was continuously coated with a coating solution having the following composition using a wire bar. Thereafter, the cured layer N1 was dried with warm air at 80° C. for 5 minutes, thereby obtaining a laminate 1 in which a polyvinyl alcohol (PVA) layer having a thickness of 1.0 μm was formed on the cured layer N1.

| Composition of composition B1 for forming oxygen blocking layer | |
| --- | --- |
| Modified polyvinyl alcohol shown below: | 3.80 parts by mass |
| Initiator Irg2959: | 0.20 parts by mass |
| Water: | 70 parts by mass |
| Methanol: | 30 parts by mass |

Modified polyvinyl alcohol $-(CH_2-CH)_{96.8}-(CH_2-CH)_{1.5}-(CH_2-CH)_{1.7}-$
$\quad\quad\ \ |\quad\quad\quad\quad\ \ |\quad\quad\quad\quad\ \ |$
$\quad\quad\ OH\quad\quad\ \ OCOCH_3\quad\ \ OCONHCH_2CH_2OCOC{=}CH_2\ \ CH_3$ In this manner, a laminate A including the cellulose acylate film 1 (transparent support), the alignment layer PA1, the polarizer P1, the cured layer N1, and the oxygen blocking layer B1 adjacent to each other in this order was obtained.

[Preparation of TAC Film A1 Having Positive A-Plate A1]

The cellulose acylate film 1 was continuously coated with a coating solution PA10 for forming n alignment layer described below with a wire bar. The support on which a coating film was formed was dried with warm air at 140° C. for 120 seconds, and the coating film was irradiated with polarized ultraviolet rays (10 mJ/cm², using an ultra-high pressure mercury lamp) to form a photo-alignment layer PA2 having a thickness of 0.2 sun, thereby obtaining a TAC film provided with a photo-alignment layer.

The photo-alignment layer PA2 was coated with the composition A-1 having the composition described below using a bar coater. The coating film formed on the photo-alignment layer PA2 was heated to 120° C. with warm air, cooled to 60° C., irradiated with ultraviolet rays at a wavelength of 365 nm with an illuminance of 100 mJ/cm² using a high-pressure mercury lamp in a nitrogen atmosphere, and continuously irradiated with ultraviolet rays with an illuminance of 500 mJ/cm² while being heated at 120° C. so that the alignment of the liquid crystal compound was fixed, thereby preparing a TAC film A1 having a positive A-plate A1.

The thickness of the positive A-plate A1 was 2.5 μm, and Re (550) was 144 nm. Further, the positive A-plate A1 satisfied the relationship of "Re (450)≤Re (550)≤Re (650)". Re (450)/Re (550) was 0.82.

| (Coating solution PA 10 for forming alignment layer) | |
|---|---|
| Polymer PA-10 shown below: | 100.00 parts by mass |
| Acid generator PAG-1 shown below: | 5.00 parts by mass |
| Acid generator CPI-110TF shown below: | 0.005 parts by mass |
| Isopropyl alcohol: | 16.50 parts by mass |
| Butyl acetate: | 1072.00 parts by mass |
| Methyl ethyl ketone: | 268.00 parts by mass |

Polymer PA-10

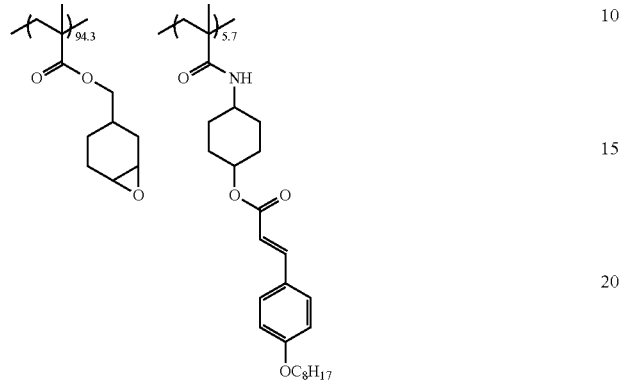

| (Composition A-1) | |
|---|---|
| Polymerizable liquid crystal compound LA-1 shown below: | 43.50 parts by mass |
| Polymerizable liquid crystal compound LA-2 shown below: | 43.50 parts by mass |
| Polymerizable liquid crystal compound LA-3 shown below: | 8.00 parts by mass |
| Polymerizable liquid crystal compound LA-4, shown below: | 5.00 parts by mass |
| Polymerization initiator PI-1 shown below: | 0.55 parts by mass |
| Leveling agent T-1 shown below: | 0.20 parts by mass |
| Cyclopentanone: | 235.00 parts by mass |

Polymerizable liquid crystal compound LA-1 (tBu represents tertiary butyl group)

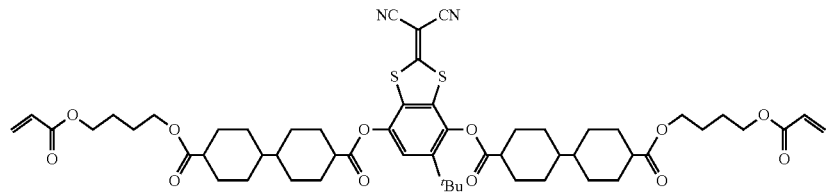 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Polymerizable liquid crystal compound LA-2

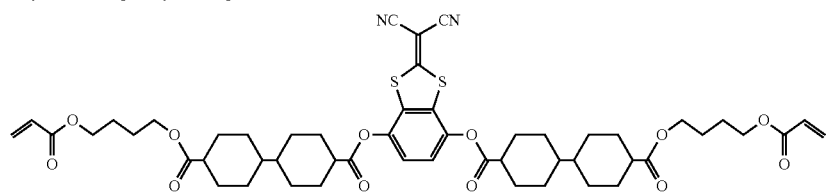

Polymerizable liquid crystal compound LA-3

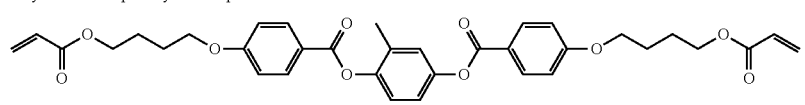

Polymerizable liquid crystal compound LA-4 (Me represents methyl group)

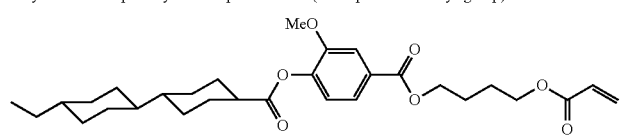

-continued (Composition A-1)

Polymerization initiator PI-1

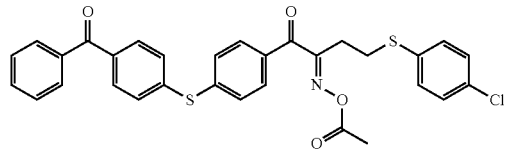 [SMILES: CC(=O)O/N=C(\CCSc1ccc(Cl)cc1)C(=O)c1ccc(Sc2ccc(C(=O)c3ccccc3)cc2)cc1]

Leveling agent T-1

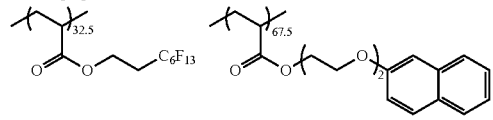

[Preparation of TAC Film C1 Having Positive C-Plate C1]

The above-described cellulose acylate film 1 was used as a temporary support.

The cellulose acylate film 1 was allowed to pass through a dielectric heating roll at a temperature of 60° C., the film surface temperature was increased to 40° C., one surface of the film was coated with an alkaline solution having the following composition such that the coating amount reached 14 ml/m² using a bar coater and heated to 110° C., and the film was transported for 10 seconds under a steam-type far-infrared heater (manufactured by Noritake Co., Ltd.).

Next, the film was coated with pure water such that the coating amount reached 3 ml/m² using the same bar coater.

Next, the process of washing the film with water using a fountain coater and draining the film using an air knife was repeated three times, and the film was transported to a drying zone at 70° C. for 10 seconds and dried, thereby preparing a cellulose acylate film 1 which had been subjected to an alkali saponification treatment.

(Alkaline Solution)
Potassium hydroxide: 4.7 parts by mass
Water: 15.8 parts by mass
Isopropanol: 63.7 parts by mass
Fluorine-containing surfactant SF-1 ($C_{14}H_{29}O(CH_2CH_2O)_{20}H$): 1.0 parts by mass
Propylene glycol: 14.8 parts by mass The cellulose acylate film 1 that had been subjected to the alkali saponification treatment was continuously coated with a coating solution 3 for forming an alignment layer having the following composition using a #8 wire bar. The obtained film was dried with warm air at 60° C. for 60 seconds and further dried with warm air at 100° C. for 120 seconds, thereby forming an alignment layer PA3.

(Coating Solution 3 for Forming Alignment Layer)
Polyvinyl alcohol (PVA103, manufactured by Kuraray Co., Ltd.): 2.4 parts by mass
Isopropyl alcohol: 1.6 parts by mass
Methanol: 36 parts by mass
Water: 60 parts by mass The alignment layer was coated with a coating solution C1 for forming a positive C-plate described below, the obtained coating film was aged at 60° C. for 60 seconds and irradiated with ultraviolet rays with an illuminance of 1000 mJ/cm² using an air-cooled metal halide lamp at an illuminance of 70 mW/cm² (manufactured by Eye Graphics Co., Ltd.), and the alignment state thereof was fixed to vertically align the liquid crystal compound, thereby preparing a TAC film C1 having a positive C-plate C1 with a thickness of 0.5 μm.

The Rth (550) of the obtained positive C-plate was −60 nm.

| (Coating solution C1 for forming positive C-plate) | |
|---|---|
| Liquid crystal compound L-11 shown below: | 80 parts by mass |
| Liquid crystal compound L-12 shown below: | 20 parts by mass |
| Vertically aligned liquid crystal compound alignment agent (S01): | 1 part by mass |
| Ethylene oxide-modified trimethylolpropane triacrylate (V #360, manufactured by Osaka Organic Chemical industry Ltd.): | 8 parts by mass |
| IRGACURE 907 (manufactured by BASF SE): | 3 parts by mass |
| KAYACURE DETX (manufactured by Nippon Kayaku Co., Ltd.): | 1 part by mass |
| Compound B03 shown below: | 0.4 parts by mass |
| Methyl ethyl ketone: | 170 parts by mass |
| Cyclohexanone: | 30 parts by mass |

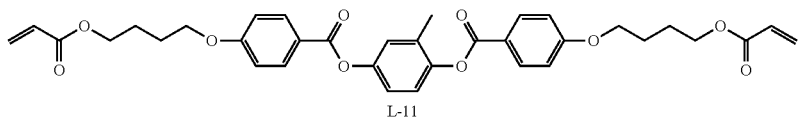

L-11

(Coating solution C1 for forming positive C-plate)

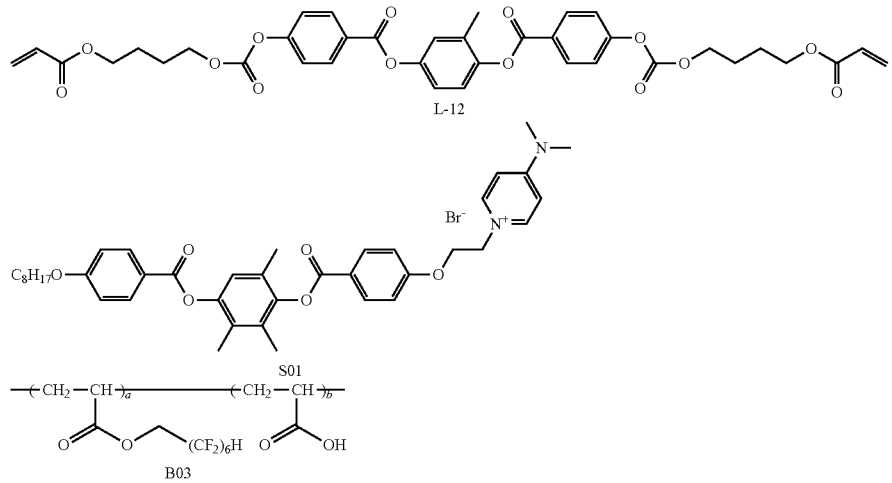

[Preparation of Pressure-Sensitive Adhesives N1 and N2]

Next, an acrylate-based polymer was prepared according to the following procedures.

95 parts by mass of butyl acrylate and 5 parts by mass of acrylic acid were polymerized by a solution polymerization method in a reaction container equipped with a cooling pipe, a nitrogen introduction pipe, a thermometer, and a stirrer, thereby obtaining an acrylate-based polymer (A1) with an average molecular weight of 2000000 and a molecular weight distribution (Mw/Mn) of 3.0.

Next, an acrylate-based pressure-sensitive adhesive was prepared with the composition listed in Table 1 below using the obtained acrylate-based polymer (A1). Each separate film that had been subjected to a surface treatment with a silicone-based release agent was coated with the composition using a die coater, dried in an environment of 90° C. for 1 minute, and irradiated with ultraviolet rays (UV) under the following conditions, thereby obtaining the following acrylate-based pressure-sensitive adhesives N1 N2 (pressure-sensitive adhesive layers). The composition and film thickness of each acrylate-based pressure-sensitive adhesive are listed in Table 1.

<UV Irradiation Conditions>
Electrodeless lamp H bulb (Fusion Co., Ltd.)
Illuminance of 600 mW/cm$^2$, light dose of 150 ml/cm$^2$
The UV illuminance and the light dose were measured using "UVPF-36" (manufactured by Eye Graphics Co., Ltd.).

(Acrylate-Based Pressure-Sensitive Adhesive N1 (Film Thickness of 15 μm))
Acrylate-based polymer (A1): 100 parts by mass
(A) Polyfunctional acrylate-based monomer: 11.1 parts by mass
(B) Photopolymerization initiator: 1.1 parts by mass
(C) Isocyanate-based crosslinking agent: 1.0 parts by mass
(D) Silane coupling agent: 0.2 parts by mass (Acrylate-Based Pressure-Sensitive Adhesive N2 (Film Thickness of 25 μm))
Acrylate-based polymer (A1): 100 parts by mass
(C) Isocyanate-based crosslinking agent: 1.0 parts by mass
(D) Silane coupling agent: 0.2 parts by mass (A) Polyfunctional acrylate-based monomer tris(acryloyloxyethyl) isocyanurate, molecular weight=423, trifunctional type (trade name, "ARONIX M-315", manufactured by Toagosei Co., Ltd.), (B) Photopolymerization initiator: mixture of benzophenone and 1-hydroxycyclohexylphenyl ketone at mass ratio of 1:1, "IRGACURE 500" (manufactured by Ciba Specialty Chemicals, Inc.)

(C) Isocyanate-based crosslinking agent: trimethylolpropane-modified tolylene diisocyanate
("CORONATE L", manufactured by Nippon Polyurethane Industry Co., Ltd.)

(D) Silane coupling agent: 3-glycidoxypropyltrimethoxysilane ("KBM-403", manufactured by Shin-Etsu Chemical Co., Ltd.)

<Preparation of UV Adhesive>
The following UV adhesive composition was prepared.

| UV adhesive composition | |
|---|---|
| CEL2021P (manufactured by Daicel Corporation) | 70 parts by mass |
| shown below: | |
| 1,4-Butanediol diglycidyl ether: | 20 parts by mass |
| 2-Ethythexyl glycidyl ether: | 10 parts by mass |
| CPI-100P: | 2.25 parts by mass |

CPI-100P

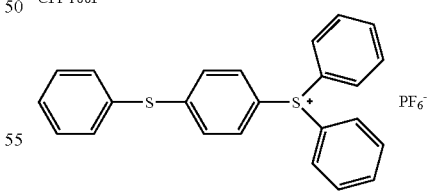

[Preparation of Laminate of Example 1]

The phase difference side of the TAC film A1 having the positive A-plate A1 and the phase difference side of the TAC film C1 having the positive C-plate C1 were attached to each other by being irradiated with UV rays at an illuminance of 600 mJ/cm$^2$ using the UV adhesive composition. The thickness of the UV adhesive layer was 3 μm. Further, the surfaces to be attached to each other with the UV adhesive were subjected to a corona treatment. Next, the photo-alignment layer PA2 on the positive A-plate A1 side and the cellulose acylate film 1 were removed to obtain a phase difference plate 1.

The oxygen blocking layer side of the laminate A was attached to the support side of the low-reflection surface film CV-LC5 (manufactured by Fujifilm Corporation) using the pressure-sensitive adhesive N1. Next, only the cellulose acylate film 1 was removed, and the removed surface and the positive A-plate A1 side of the phase difference plate 1 were attached to each other using the pressure-sensitive adhesive N1, thereby preparing a laminate A-1. Here, the attachment was made such that the angle between the absorption axis of the polarizer P1 and the slow axis of the positive A-plate A1 reached 45°.

Next, the alignment layer PA3 on the positive C-plate C1 side and the cellulose acylate film 1 in the laminate A-1 were removed, and the positive C-plate C1 and the glass substrate (product name, EAGLE XG, manufactured by Corning Inc., thickness of 1 mm) were attached to each other using the pressure-sensitive adhesive N2 to prepare an evaluation sample in Example 1.

Examples 2 to 4

Each evaluation sample of Examples 2 to 4 was prepared by the same method as in Example 1 except that the composition for forming a polarizer formed of the second dichroic material listed in Table 1 was used in place of the second dichroic material M-1 contained in the composition P1 for forming a polarizer.

Further, the second dichroic materials M-2 to M-4 used in Examples 2 to 4 are as follows.

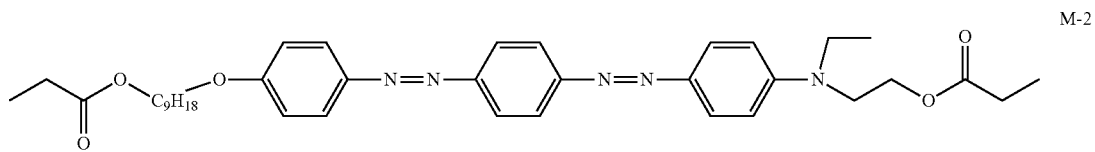

M-2

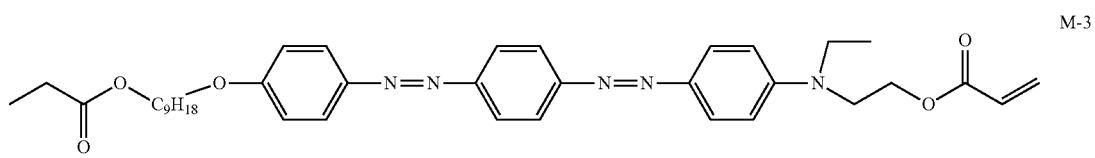

M-3

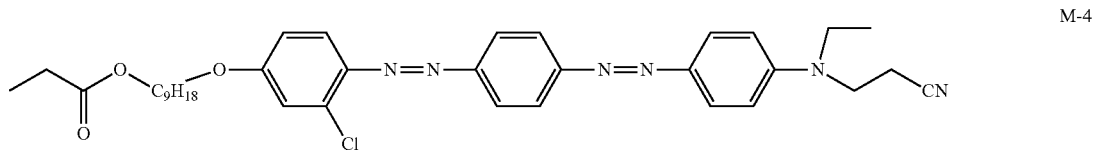

M-4

Example 5

An evaluation sample in Example 5 was prepared by the same method as in Example 1 except that the polarizer P5 prepared by the following method was used in place of the polarizer P1.

[Preparation of Polarizer P5]

The obtained alignment film PA1 was continuously coated with the following composition P5 for forming a polarizer with a wire bar, thereby forming a coating layer P5.

Next, the coating layer P5 was heated at 140° C. for 30 seconds, and the coating layer P5 was cooled to room temperature (23° C.).

Next, the coating layer P5 was heated at 75° C. for 60 seconds and cooled to room temperature again.

Thereafter, the coating layer was irradiated with an LED lamp (center wavelength of 365 nm) for 2 seconds under an irradiation condition of an illuminance of 200 mW/cm$^2$, thereby preparing a polarizer P5 on the alignment layer PA1. The film thickness of the polarizer P5 1 was 0.6 μm.

| Composition of composition P5 for forming polarizer | |
|---|---|
| First dichroic material C-1 shown below: | 0.59 parts by mass |
| Second dichroic material M-1: | 0.36 parts by mass |
| Third dichroic material Y-2 shown below: | 0.24 parts by mass |
| Polymer liquid crystal compound L-2 shown below: | 3.45 parts by mass |
| Low-molecular-weight liquid crystal compound L-3 shown below: | 2.10 parts by mass |
| Polymerization initiator IRGACURE OXE-02 (manufactured by BASF SE): | 0.21 parts by mass |
| Surfactant F-2 shown below: | 0.05 parts by mass |
| Cyclopentanone: | 45.34 parts by mass |
| Tetrahydrofuran: | 45.34 parts by mass |
| Benzyl alcohol: | 2.33 parts by mass |

Y-2

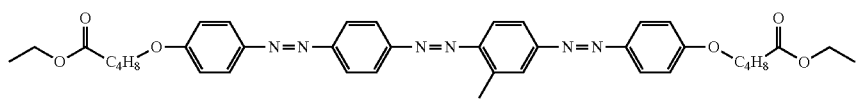

Polymer liquid crystal compound L2

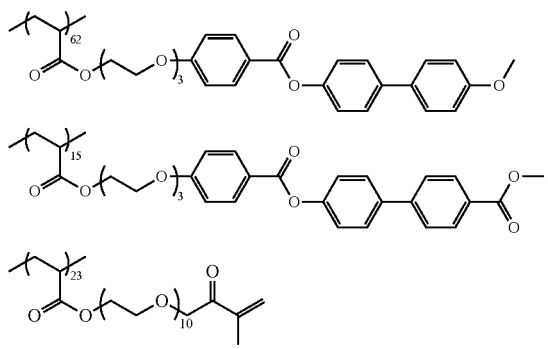

Low-molecular-weight liquid crystal compound L-3

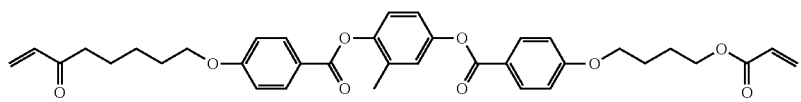 [SMILES: C=CC(=O)CCCCCOc1ccc(C(=O)Oc2ccc(OC(=O)c3ccc(OCCCCOC(=O)C=C)cc3)cc2C)cc1]

Surfactant F-2

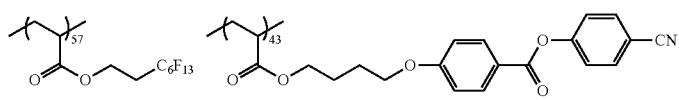

Comparative Examples 1 and 2

Each evaluation sample in Comparative Example 1 and 2 was prepared by the same method as in Example 1 except that the composition for forming a polarizer formed of the second dichroic material listed in Table 1 was used in place of the second dichroic material M-1 contained in the composition P1 for forming a polarizer.

Further, the second dichroic materials M-5 and M-6 used in Comparative Examples 1 and 2 are as follows.

[Structure M-5]

[Structure M-6]

[Measurement of Maximum Absorption Wavelength]

The maximum absorption wavelengths of the dichroic materials used in the examples and the comparative examples were measured. The maximum absorption wavelength was acquired from the ultraviolet visible light spectrum in a wavelength range of 250 to 800 nm which was measured by a spectrophotometer (product name, "UV-3150", manufactured by Shimadzu Corporation) using a solution in which the dichroic material was dissolved in a good solvent.

[Calculation of Stabilization Energy]

The stabilization energy (unit: kcal/mol) was calculated using AMBER 11 according to the above-described calculation method. The calculation results of the stabilization energy are listed in Table 1.

In the above-described calculation method, the first dichroic material corresponds to the dichroic material A, and the second dichroic material corresponds to the dichroic material B.

[Calculation of Log P Value]

The Log P values of the first dichroic material and the second dichroic material were calculated according to the above-described calculation method. Further, the Log P difference (absolute value) between the first dichroic material and the second dichroic material was acquired based on the obtained values.

[Measurement of Degree of Alignment Corrected for Visual Sensitivity]

The degrees of alignment corrected for visual sensitivity were acquired by the following procedure for the evaluation samples of the examples and the comparative examples which were obtained in the above-described manner.

Here, the degree of alignment corrected for visual sensitivity indicates an average value obtained by disposing a light source, a linear polarizer, and an evaluation sample in this order, measuring the transmittance in a wavelength range of 380 to 780 nm incident from the transparent support side, calculating the degree of alignment of each wavelength by the following equation, and averaging the values obtained by multiplying the degrees of alignment by the visual sensitivity correction coefficient. The evaluation sample was disposed such that the glass surface side of the evaluation sample was in contact with the linear polarizer. An automatic polarizing film measuring device V-7100 (manufactured by JASCO Corporation) was used for measuring the transmittance.

$$S=(Ax-Ay)/[2\times Ay+Ax] \quad \text{Degree of alignment:}$$

Ax: Absorbance in a case where incidently polarized light and the polarizer of the evaluation sample were arranged so as to form crossed nicol Ay: Absorbance in a case where incidently polarized light and the polarizer of the evaluation sample were arranged so as to form parallel nicol $$Ax=-\log_{10}(Tx/100)$$

$$Ay=-\log_{10}(Ty/100)$$

Tx: Transmittance in a case where incidently polarized light and the polarizer of the evaluation sample were arranged so as to form crossed nicol (incident polarized light was set to 100%)

Ty: Transmittance in a case where incidently polarized light and the polarizer of the evaluation sample were arranged so as to form parallel nicol (incident polarized light was set to 100%)

[Measurement of Degree of Polarization Before Durability Test]

The degree P of polarization corrected for visual sensitivity was calculated by the following equation based on the transmittance value obtained in the section of "measurement of degree of alignment corrected for visual sensitivity".

$$\text{Degree of polarization: } P(\%)=100\times\sqrt{[(Tp-Tc)/(Tp+Tc)]}$$

$$Tp=\{(Ty)^2+(Tx)^2\}/2$$

$$Tc=Ty\times Tx$$

Tx: Transmittance in a case where incidently polarized light and the polarizer of the evaluation sample were arranged so as to form crossed nicol (incident polarized light was set to 100%)

Ty: Transmittance in a case where incidently polarized light and the polarizer of the evaluation sample were arranged so as to form parallel nicol (incident polarized light was set to 100%)

[Measurement of Degree of Polarization after Durability Test]

The following durability tests A to C were performed on the evaluation samples of the examples and the comparative examples obtained in the above-described manner. The degree of polarization was calculated by the same procedure as that for the "measurement of degree of polarization of before durability test" except that the evaluation sample after each durability test was used.

(Durability Test A)

The evaluation sample was set in a light resistance tester (Super Xenon Fade Meter SX75F, manufactured by Suga Test Instruments Co., Ltd.), and the low reflection surface film CV-LC5 side in the evaluation sample was irradiated with light from a xenon lamp light source for 65 hours under conditions of a wavelength of 300 to 400 nm, an irradiance of 150 W/m$^2$, and a black panel temperature of 63° C.

(Durability Test B)

The evaluation sample was set in a thermohygrostat and stored under conditions of a temperature of 80° C. and a relative humidity of less than 10% RH for 500 hours.

(Durability Test C)

The evaluation sample was set in a thermohygrostat and stored under conditions of a temperature of 60° C. and a relative humidity of less than 90% RH for 500 hours.

A rate ΔP of change in the degree of polarization was acquired according to the following equation based on the values of the degrees of polarization before and after the durability test measured as described above. It can be said that the durability is excellent as the value of ΔP is closer to 0. The evaluation results are listed in Table 1.

Rate ΔP of change in degree of polarization=(degree P of polarization after durability test)−(degree P of polarization before durability test)

In particular, based on the comparison of Examples 1 to 5, in a case where the second dichroic material M-1 in which at least one of R5 or R6 in Formula (2) represents a methyl group is used (Examples 1 and 5), it was found that the durability with respect to light irradiation (durability test A) and the durability under a high temperature condition (durability test B) are more excellent.

[Preparation of Organic EL Display Device]

GALAXY S4 (manufactured by Samsung Electronics Co., Ltd.) equipped with an organic EL panel (organic EL display element) was disassembled, the touch panel provided with a circularly polarizing plate was peeled off from the organic EL display device, and the circularly polarizing plate was further peeled off from the touch panel so that the organic EL display element, the touch panel, and the circularly polarizing plate were isolated from each other. Next, the isolated touch panel was reattached to the organic EL display element, and the positive C-plate C1 side in the laminate was further attached to the touch panel with the pressure-sensitive adhesive N2 using the laminate immediately before the attachment of the glass base material of Examples 1 to 5 to prepare an organic EL display device. As a result, it was confirmed that the antireflection effect was observed.

TABLE 1

| | Liquid crystal compound Type | First dichroic material | | | Second dichroic material | | | | Third dichroic material | | Degree of alignment corrected for visual sensitivity | Results of durability test | | |
|---|---|---|---|---|---|---|---|---|---|---|---|---|---|---|
| | | Type | Maximum absorption wavelength (nm) | log P value | Type | Maximum absorption wavelength (nm) | Stabilization energy (kcal/mol) | log P value | log P difference between first dichroic material and second material (absolute value) | Type | Maximum absorption wavelength (nm) | | Durability test A | Durability test B | Durability test C |
| Example 1 | L-1 | C-1 | 591 | 10.61 | M-1 | 466 | 15.8 | 10.30 | 0.31 | Y-1 | 418 | 0.977 | −1.5 | −1.8 | −0.5 |
| Example 2 | L-1 | C-1 | 591 | 10.61 | M-2 | 471 | 14.8 | 10.74 | 0.13 | Y-1 | 418 | 0.970 | −2.2 | −2.7 | −0.5 |
| Example 3 | L-1 | C-1 | 591 | 10.61 | M-3 | 471 | 14.8 | 10.57 | 0.04 | Y-1 | 418 | 0.969 | −2.2 | −1.5 | −0.8 |
| Example 4 | L-1 | C-1 | 591 | 10.61 | M-4 | 460 | 24.1 | 9.83 | 0.78 | Y-1 | 418 | 0.964 | −2.2 | −3.0 | 0.0 |
| Example 5 | L-2 L-3 | C-1 | 591 | 10.61 | M-1 | 466 | 15.8 | 10.30 | 0.31 | Y-2 | 418 | 0.975 | −1.8 | −1.0 | 0.8 |
| Comparative Example 1 | L-1 | C-1 | 591 | 10.61 | M-5 | 484 | 34.4 | 10.98 | 0.37 | Y-1 | 418 | 0.964 | −3.5 | −4.9 | −1.2 |
| Comparative Example 2 | L-1 | C-1 | 591 | 10.61 | M-6 | 465 | 22.4 | 9.46 | 1.15 | Y-1 | 418 | 0.971 | −3.0 | −3.4 | −3.3 |

As listed in Table 1, in a case where in the polarizer formed from the composition for forming a polarizer containing a polymer liquid crystal compound and a dichroic material, the absolute value of a difference between the log P value of the first dichroic material and the log P value of the second dichroic material is 1.0 or less and the stabilization energy calculated based on the first dichroic material and the second dichroic material is 30 kcal/mol or less (Examples 1 to 5), it was found that the durability of the polarizer is excellent as compared with the polarizer (Comparative Examples 1 and 2) that does not satisfy the above-described conditions.

What is claimed is:

1. A polarizer comprising:

a composition for forming a polarizer which contains a polymer liquid crystal compound and a dichroic material, wherein the dichroic material includes a first dichroic material and a second dichroic material, an absolute value of a difference between a log P value of the first dichroic material and a log P value of the second dichroic material is 1.0 or less, a stabilization energy in a case where one dichroic material of the first dichroic material or the second dichroic material is incorporated into a structure formed of the other dichroic material of the first dichroic material or the second dichroic material is 30 kcal/mol or less, and the second dichroic material is a compound represented by Formula (2):

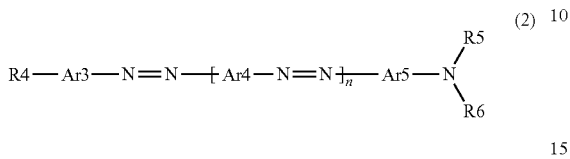

in Formula (2), n represents 1 or 2, in Formula (2), Ar3, Ar4, and Ar5 each independently represent a phenylene group which may have a substituent, a naphthylene group which may have a substituent, or a heterocyclic group which may have a substituent, in Formula (2), R4 represents a hydrogen atom, an alkyl group, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group, which may have a substituent, in Formula (2), R5 and R6 each independently represent a hydrogen atom, an alkyl group, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, which may have a substituent, and R5 and R6 may be bonded to each other to form a ring, and R5 or R6 may be bonded to Ar5 to form a ring.

2. The polarizer according to claim 1, wherein the first dichroic material is a compound represented by Formula (1),

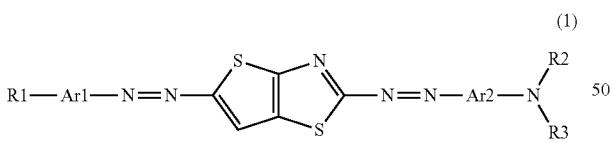

in Formula (1), Ar1 and Ar2 each independently represent a phenylene group which may have a substituent or a naphthylene group which may have a substituent, in Formula (1), R1 represents a hydrogen atom, an alkyl group, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group, which may have a substituent, in Formula (1), R2 and R3 each independently represent a hydrogen atom, an alkyl group, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, which may have a substituent, and R2 and R3 may be bonded to each other to form a ring, and R2 or R3 may be bonded to Ar2 to form a ring.

3. The polarizer according to claim 2, wherein in Formula (2), n represents 1.

4. The polarizer according to claim 2, wherein in Formula (2), at least one of R5 or R6 represents a methyl group.

5. The polarizer according to claim 1, wherein the first dichroic material has a maximum absorption wavelength in a range of 560 nm or greater and 700 nm or less, and the second dichroic material has a maximum absorption wavelength in a range of 455 nm or greater and less than 560 nm.

6. The polarizer according to claim 2, wherein the log P value of the first dichroic material is greater than the log P value of the second dichroic material.

7. The polarizer according to claim 1, wherein a content of the dichroic material is 5% by mass or greater with respect to a total mass of the polarizer.

8. An image display device comprising: the polarizer according to claim 1.

9. The polarizer according to claim 1, wherein in Formula (2), n represents 1.

10. The polarizer according to claim 3, wherein in Formula (2), at least one of R5 or R6 represents a methyl group.

11. The polarizer according to claim 2, wherein the first dichroic material has a maximum absorption wavelength in a range of 560 nm or greater and 700 nm or less, and the second dichroic material has a maximum absorption wavelength in a range of 455 nm or greater and less than 560 nm.

12. The polarizer according to claim 1, wherein the log P value of the first dichroic material is greater than the log P value of the second dichroic material.

13. The polarizer according to claim 2, wherein a content of the dichroic material is 5% by mass or greater with respect to a total mass of the polarizer.

14. An image display device comprising: the polarizer according to claim 2.

15. The polarizer according to claim 1, wherein the first dichroic material has a maximum absorption wavelength in a range of 560 nm or greater and 700 nm or less, and the second dichroic material has a maximum absorption wavelength in a range of 455 nm or greater and less than 560 nm.

16. The polarizer according to claim 3, wherein the log P value of the first dichroic material is greater than the log P value of the second dichroic material.

17. The polarizer according to claim 1, wherein a content of the dichroic material is 5% by mass or greater with respect to a total mass of the polarizer.

18. An image display device comprising:
the polarizer according to claim 1.

* * * * *